(12) United States Patent  
Cochrane

(10) Patent No.: US 7,995,355 B2  
(45) Date of Patent: Aug. 9, 2011

(54) THREE-DIMENSIONAL CONFIGURATIONS PROVIDING ELECTROMAGNETIC INTERFERENCE SHIELDING FOR ELECTRONICS ENCLOSURES

(75) Inventor: Paul Douglas Cochrane, Cary, NC (US)

(73) Assignee: Stealthdrive, Inc., Alexandria, VA (US)

( * ) Notice: Subject to any disclaimer, the term of this patent is extended or adjusted under 35 U.S.C. 154(b) by 790 days.

(21) Appl. No.: 11/795,050

(22) PCT Filed: Jan. 10, 2006

(86) PCT No.: PCT/US2006/000596
§ 371 (c)(1),
(2), (4) Date: Jul. 10, 2007

(87) PCT Pub. No.: WO2006/076258
PCT Pub. Date: Jul. 20, 2006

(65) Prior Publication Data
US 2008/0158851 A1    Jul. 3, 2008

Related U.S. Application Data

(60) Provisional application No. 60/642,694, filed on Jan. 10, 2005.

(51) Int. Cl.
*H05K 9/00* (2006.01)

(52) U.S. Cl. ........ 361/818; 361/800; 361/816; 174/350; 174/377

(58) Field of Classification Search .................. 361/800, 361/816, 818, 753, 799; 174/350, 377
See application file for complete search history.

(56) References Cited

U.S. PATENT DOCUMENTS

| 4,567,318 | A  | * | 1/1986 | Shu ............................. 174/372 |
| 4,759,466 | A  | * | 7/1988 | Chase et al. ................. 220/4.02 |
| 5,001,298 | A  | * | 3/1991 | Jong ............................ 174/372 |
| 5,095,177 | A  | * | 3/1992 | Johnson ....................... 174/372 |
| 5,565,656 | A  | * | 10/1996 | Mottahed .................... 174/372 |
| 6,320,121 | B1 | * | 11/2001 | Honeycutt et al. ........... 174/384 |
| 6,323,418 | B1 | * | 11/2001 | Tiburtius et al. ............. 174/387 |
| 6,621,000 | B2 | * | 9/2003 | Jensen et al. ................. 174/359 |
| 7,342,184 | B2 | * | 3/2008 | Cochrane ..................... 174/367 |
| 7,511,230 | B2 | * | 3/2009 | Cochrane ..................... 174/382 |
| 7,643,310 | B2 | * | 1/2010 | Long ............................ 361/816 |

* cited by examiner

*Primary Examiner* — Dameon E Levi
(74) *Attorney, Agent, or Firm* — David Dort; Stealthdrive, Inc.

(57) ABSTRACT

The present invention provides a configuration of an electronics enclosure, including a computer chassis in which three-dimensional shapes that may be in the form of a partial or quarter-sphere or cube or other periodic "patterns" may be stamped, molded, cut, or extruded into a lid and a five-sided "box" to provide improved EMI shielding, such that the need for gaskets is reduced or eliminated.

18 Claims, 22 Drawing Sheets

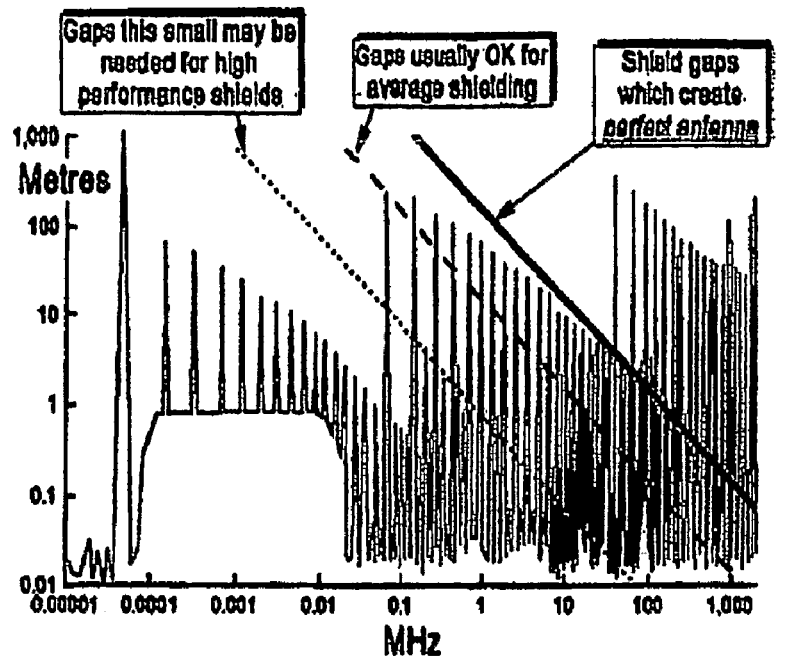
FIG. 1D
(Prior Art)
FIG. 1E
(Prior Art)
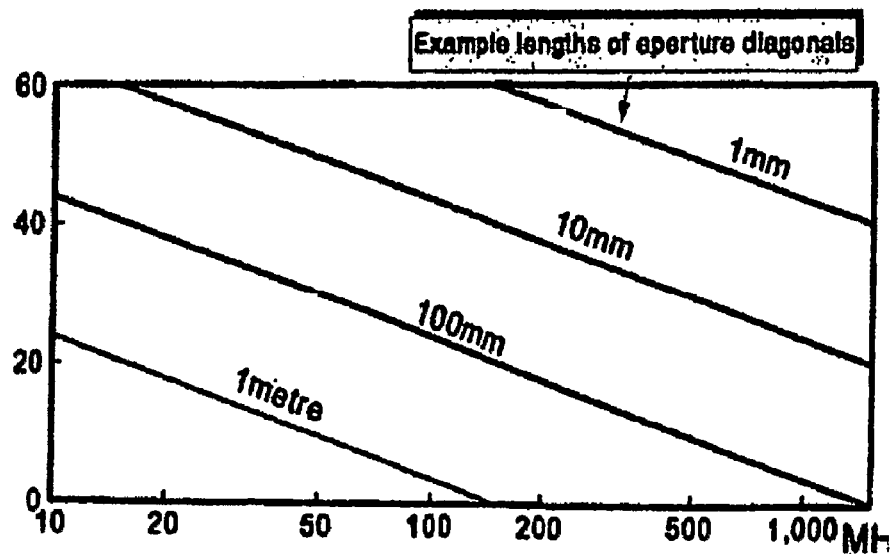

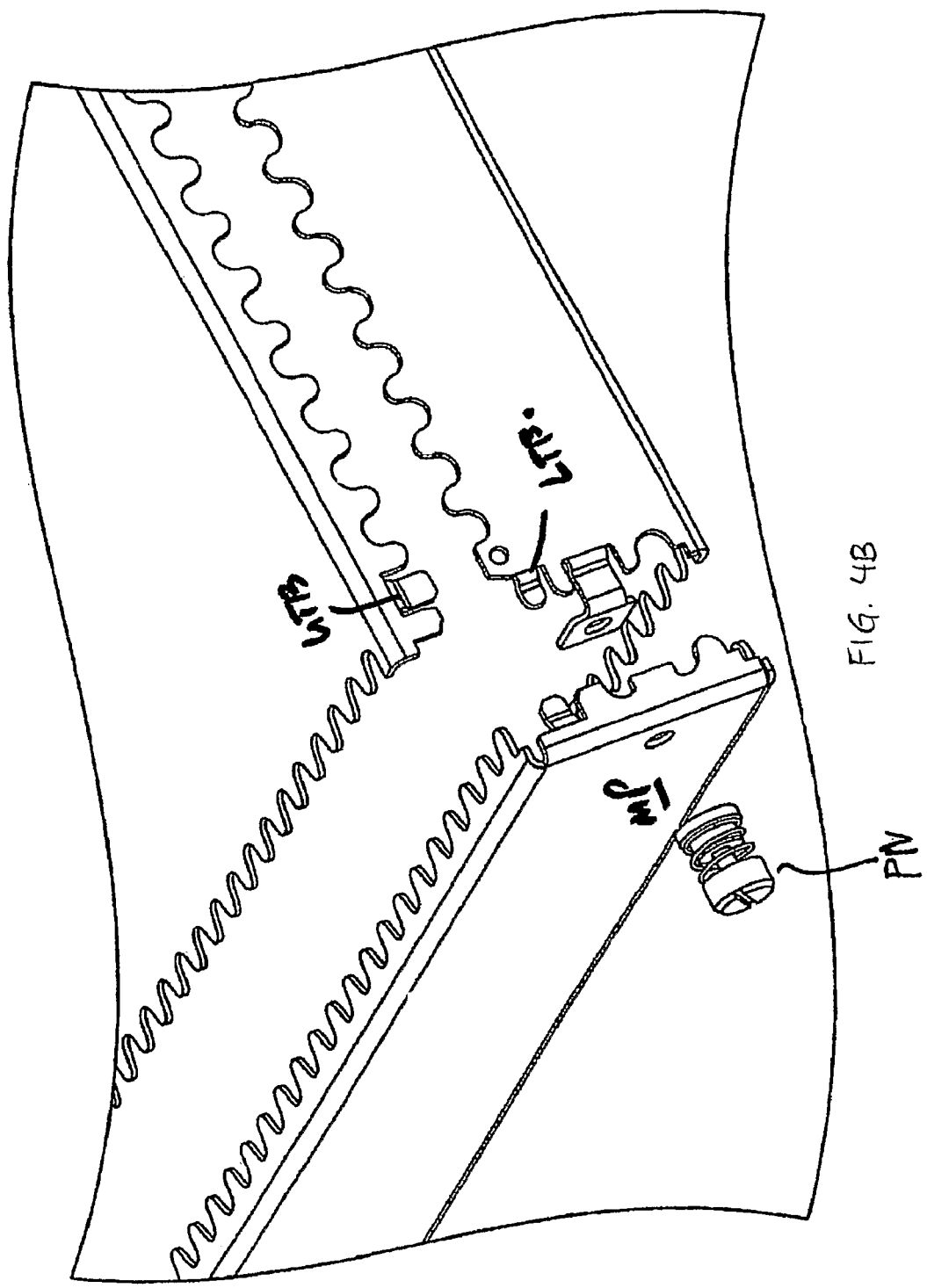

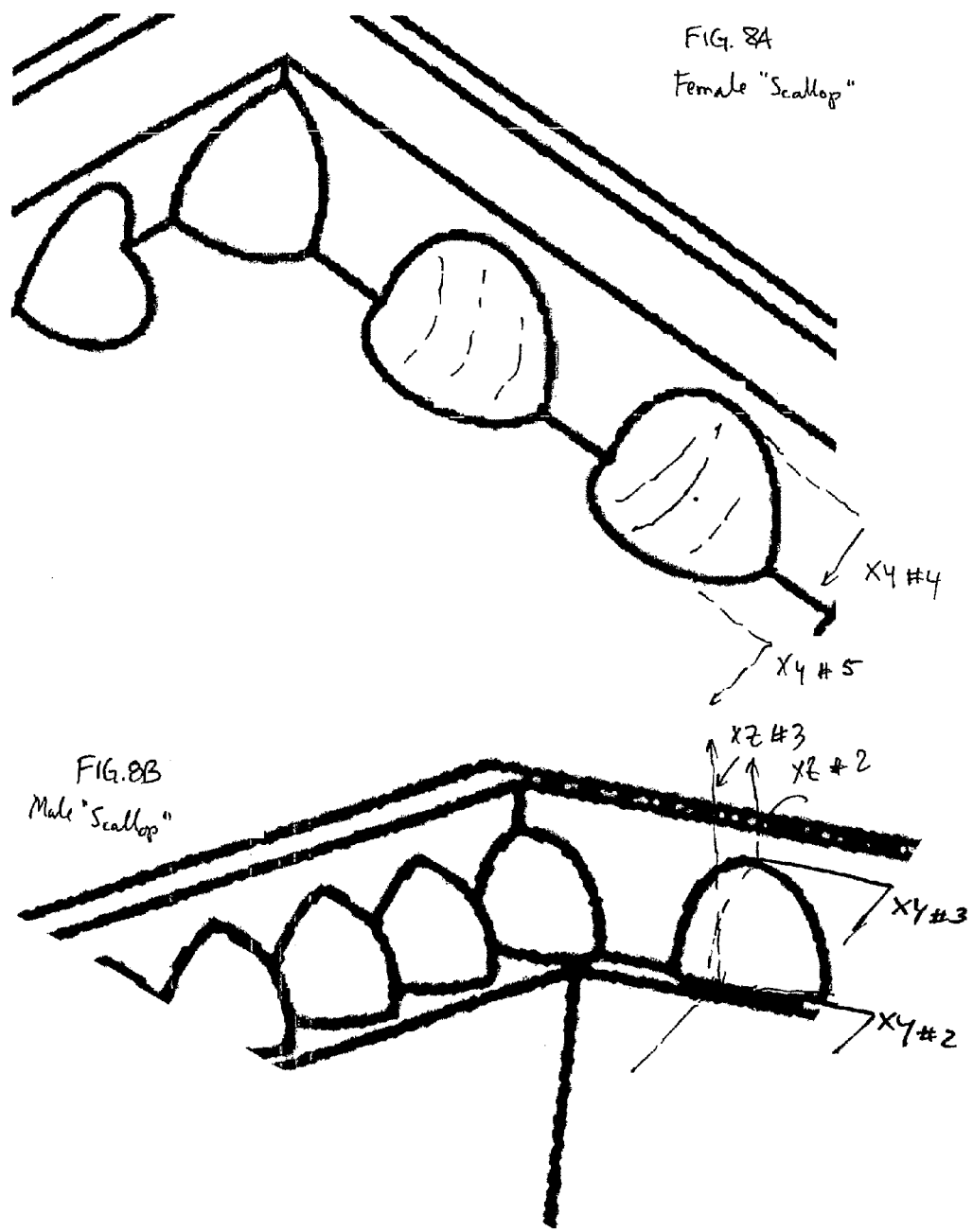

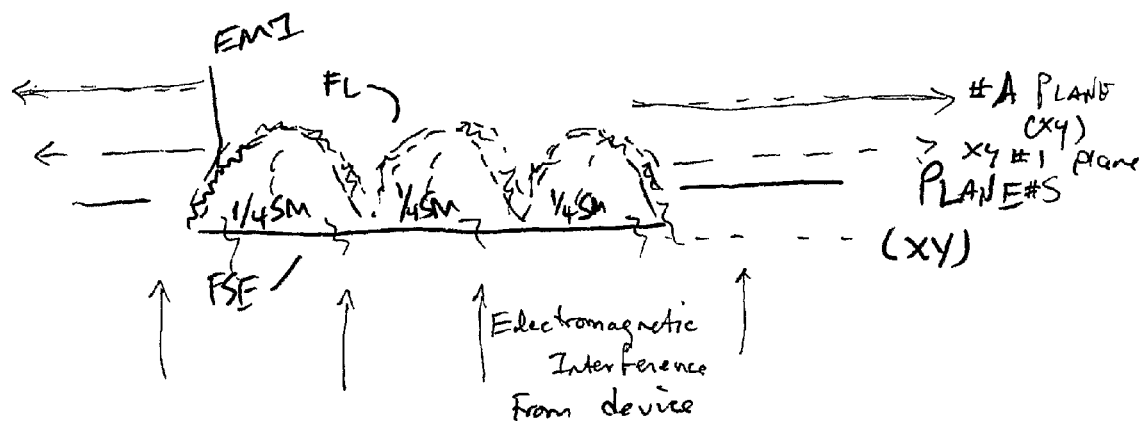

THREE-DIMENSIONAL CONFIGURATIONS PROVIDING ELECTROMAGNETIC INTERFERENCE SHIELDING FOR ELECTRONICS ENCLOSURES

REFERENCE TO PRIORITY DOCUMENTS

The present application claims priority to U.S. patent application Ser. No. 11/270,827, filed Nov. 10, 2005 and entitled THREE-DIMENSIONAL CONFIGURATIONS PROVIDING ELECTROMAGNETIC INTERFERENCE SHIELDING FOR ELECTRONICS ENCLOSURES which is a continuation-in-part and claims priority under 35 USC §120 to U.S. application Ser. No. 11/080,385: entitled "Reduced cost and gasketting "one-hit" and other manufacturing EMI-shielding solutions for computer enclosures" filed Mar. 15, 2005, invented by Paul Douglas Cochrane. This application also claims priority under 35 USC §119(e) to U.S. Provisional Application Ser. Nos. 60/642,694, filed Jan. 10, 2005, entitled "Gasketless "one-hit" electromagnetic interference (EMC) shielding solutions for the manufacture of computers chassis and other electronic component containers" by Paul Douglas Cochrane. All of the above-reference patent applications are incorporated by reference, for all purposes.

BACKGROUND

The following background section is, in part, reprinted from "Design Techniques for EMC—Part 4 Shielding" by Eur Ing Keith Armstrong, Cherry Clough Consultants, Associate of EMC-UK.

A complete volumetric shield is often known as a "Faraday Cage", although this can give the impression that a cage full of holes (like Mr Faraday's original) is acceptable, which it generally is not. There is a cost hierarchy to shielding which makes it commercially important to consider shielding early in the design process. Shields may be fitted around the following: individual ICs—example cost 25P; segregated areas of PCB circuitry—example cost £1; whole PCBs—example cost £10; sub-assemblies and modules—example cost £15; complete products—example cost £100; assemblies (e.g. industrial control and instrumentation cubicles)—example cost £1,000; rooms—example cost £10,0000; and buildings—example cost £100,000.

Shielding always adds cost and weight, so it is always best to use the other techniques described in this series to improve EMC and reduce the need for shielding. Even when it is hoped to avoid shielding altogether, it is best to allow for Murphy's Law and design from the very conception so that shielding can be added later if necessary. A degree of shielding can also be achieved by keeping all conductors and components very close to a solid metal sheet. Ground-planed PCBs populated entirely by low-profile surface mounted devices are therefore are recommended for their EMC advantages.

A useful degree of shielding can be achieved in electronic assemblies firstly, by keeping their internal electronic units and cables very close to an earthed metal surface at all times, and secondly, by bonding their earths directly to the metal surface instead of (or as well as) using a safety star earthing system based on green/yellow wires. This technique usually uses zinc-plated mounting plates or chassis, and can help avoid the need for high values of enclosure SE.

Many textbooks have been written on the subject of how shields work, and it is not intended to repeat them here. However, a few broad concepts will help. A shield puts an impedance discontinuity in the path of a propagating radiated electromagnetic wave, reflecting it and/or absorbing it. This is conceptually very similar to the way in which filters work—they put an impedance discontinuity in the path of an unwanted conducted signal. The greater the impedance ratio, the greater the SE.

At thicknesses of 0.5 mm or over, most normal fabrication metals provide good SE above 1 MHz and excellent SE above 100 MHz. Problems with metal shields are mostly caused by thin materials, frequencies below 1 MHz, and apertures.

It is generally best to allow a large distance between the circuits that are shielded and the walls of their shield. The emitted fields outside of the shield, and the fields that the devices are subjected to, will generally be more "diluted" the larger the shielded volume.

When enclosures have parallel walls opposite each other, standing waves can build up at resonant frequencies and these can cause SE problems. Irregular Shaped enclosures or ones with curved or non-parallel walls will help prevent resonances. When opposing shield walls are parallel, it is desirable to prevent resonances from occurring at the same frequencies due to width, height, or length. So, in order to avoid cubic enclosures, rectangular cross-sections can be used instead of square ones, and it is preferable to avoid dimensions that are simple multiples of each other. For example, if the length is 1.5 times the width, the second resonance of the width should coincide with the third resonance of the length. It is preferable to use irrationally ratio'd dimensions, such as those provided by the Fibonacci series.

Fields come in two flavours: electric (E) and magnetic (M). Electromagnetic fields consist of E and M fields in a given ratio (giving a wave impedance E/M of 377 in air). Electric fields are easily stopped by thin metal foils since the mechanism for electric field shielding is one of charge re-distribution at a conductive boundary; therefore, almost anything with a high conductivity (low resistance) will present suitably low impedance. At high frequencies, considerable displacement currents can result from the rapid rate of charge re-distribution, but even thin aluminium can manage this well. However, magnetic fields are much more difficult to stop. They need to generate eddy currents inside the shield material to create magnetic fields that oppose the impinging field. Thin aluminium is not going to be very suitable for this purpose, and the depth of current penetration required for a given SE depends on the frequency of the field. The SE also depends on the characteristics of the metal used for the shield which is known as the "skin effect".

The skin depth of the shield material known as the "skin effect" makes the currents caused by the impinging magnetic field to be reduced by approximately 9 dB. Hence a material which was as thick as 3 skin depths would have an approximately 27 dB lower current on its opposite side and have an SE of approximately 27 dB for that M field.

The skin effect is especially important at low frequencies where the fields experienced are more likely to be predominantly magnetic with lower wave impedance than 377Ω. The formula for skin depth is given in most textbooks; however, the formula requires knowledge of the shielding material's conductivity and relative permeability.

Copper and aluminium have over 5 times the conductivity of steel, so are very good at stopping electric fields, but have a relative permeability of 1 (the same as air). Typical mild steel has a relative permeability of around 300 at low frequencies, falling to 1 as frequencies increase above 100 kHz. The higher permeability of mild steel gives it a reduced skin depth, making the reasonable thicknesses better than aluminium for shielding low frequencies. Different grades of steels (especially stainless) have different conductivities and permeabilities, and their skin depths will vary considerably as a result. A good material for a shield will have high conductivity and high permeability, and sufficient thickness to achieve the required number of skin-depths at the lowest frequency of concern. 1 mm thick mild steel plated with pure zinc (for instance 10 microns or more) is suitable for many applications.

It is easy to achieve SE results of 100 dB or more at frequencies above 30 MHz with ordinary constructional metalwork. However, this assumes a perfectly enclosing shield volume with no joints or gaps, which makes assembly of the product rather difficult unless you are prepared to seam-weld it completely and also have no external cables, antenna, or sensors (rather an unusual product). In practice, whether shielding is being done to reduce emissions or to improve immunity, most shield performance are limited the apertures within it.

Considering apertures as holes in an otherwise perfect shied implies that the apertures act as half-wave resonant "slot antenna". This allows us to make predictions about maximum aperture sizes for a given SE: for a single aperture, SE=20 log($\Omega$/2d) where $\Omega$ is the wavelength at the frequency of interest and d is the longest dimension of the aperture. In practice, this assumption may not always be accurate, but it has the virtue of being an easy design tool which is a good framework. It may be possible to refine this formula following practical experiences with the technologies and construction methods used on specific products.

The resonant frequency of a slot antenna is governed by its longest dimension—its diagonal. It makes little difference how wide or narrow an aperture is, or even whether there is a line-of-sight through the aperture.

Even apertures, the thickness of a paint or oxide film, formed by overlapping metal sheets, still radiate (leak) at their resonant frequency just as well as if they were wide enough to poke a finger through. One of the most important EMC issues is keeping the product's internal frequencies internal, so they don't pollute the radio spectrum externally.

The half-wave resonance of slot antenna (expressed in the above rule of thumb: SE=20 log(2d)) using the relationship v=f$\lambda$ (where v is the speed of light: $3 \cdot 10^8$ meters/sec, is the frequency in Hz, and is the wavelength in meters). We find that a narrow 430 mm long gap along the front edge of a 19-inch rack unit's front panel will be half-wave resonant at around 350 MHz. At this frequency, our example 19" front panel is no longer providing much shielding and removing it entirely might not make much difference.

For an SE of 20 dB at 1 GHz, an aperture no larger than around 16 mm is needed. For 40 dB this would be only 1.6 mm, requiring the gaskets to seal apertures and/or the use of the waveguide below cut-off techniques described later. An actual SE in practice will depend on internal resonances between the walls of the enclosure itself, the proximity of components and conductors to apertures (keep noisy cables such as ribbon cables carrying digital busses well away from shield apertures and joints) and the impedances of the fixings used to assemble the parts of the enclosure, etc.

Wherever possible, it is desirable to break all necessary or unavoidable apertures into a number of smaller ones. Unavoidably long apertures (covers, doors, etc) may need conductive gaskets or spring fingers (or other means of maintaining shield continuity). The SE of a number of small identical apertures nearby each other is (roughly) proportional to their number (SE=20 logn, where n is the number of apertures), so two apertures will be worse by 6 dB, four by 12 dB, 8 by 18 dB, and so on. But when the wavelength at the frequency of concern starts to become comparable with the overall size of the array of small apertures, or when apertures are not near to each other (compared with the wavelength), this crude 6 dB per doubling rule breaks down because of phase cancellation effects.

Apertures placed more than half a wavelength apart do not generally worsen the SEs that achieves individually, but half a wavelength at 100 MHz is 1.5 meters. At such low frequencies on typical products smaller than this, an increased number of apertures will tend to worsen the enclosure's SE.

Apertures don't merely behave as slot antenna. Currents flowing in a shield and forced to divert their path around an aperture will cause it to emit magnetic fields. Voltage differences across an aperture will cause the aperture to emit electric fields. The author has seen dramatic levels of emissions at 130 MHz from a hole no more than 4 mm in diameter (intended for a click-in plastic mounting pillar) in a small PCB-mounted shield over a microcontroller.

The only really sensible way to discover the SE of any complex enclosure with apertures is to model the structure, along with any PCBs and conductors (especially those that might be near any apertures) with a 3-dimensional field solver. Software packages that can do this now have more user-friendly interfaces and run on desktop PCs. Alternatively the user will be able to find a university or design consultancy that has the necessary software and the skills to drive it.

Since an SE will vary strongly with the method and quality of assembly, materials, and internal PCBs and cables, it is always best to allow an SE 'safety margin' of 20 dB. It may also be advantageous to at least include design-in features that will allow improvement of the SE by at least 20 dB if there are problems with the final design's verification/qualification testing.

The frequency of 50 Hz is problematic, and an SE at this frequency with any reasonable thickness of ordinary metals is desirable. Special materials such as Mumetal and Radiometal have very high relative permeabilities, often in the region of 10,000. Their skin depth is correspondingly very small, but they are only effective up to a few tens of kHz. It is advantageous to take care not to knock items made of these materials, as this ruins their permeability and they have to be thrown away or else re-annealed in a hydrogen atmosphere. These exotic materials are used rather like channels to divert the magnetic fields away from the volume to be protected. This is a different concept to that used by ordinary shielding.

All metals shield materials with relative permeability greater than 1 can saturate in intense magnetic fields, and then don't work well as shields and often heat up. A steel or Mumetal shield box over a mains transformer to reduce its hum fields can saturate and fail to achieve the desired effect. Often, this is all that is necessary to make the box larger so it does not experience such intense local fields. Another shielding technique for low frequency shielding is active cancellation, and at least two companies have developed this technique specifically for stabilizing the images of CRT VDUs in environments polluted by high levels of power frequency magnetic fields.

FIG. 1D shows that if we extend the distance that a wave leaking through an aperture has to travel between surrounding metal walls before it reaches freedom, we can achieve respectable SEs even though the apertures may be large enough to put a fist through. This very powerful technique is called "waveguide below cut-off". Honeycomb metal constructions are really a number of waveguides below cut-off stacked side-by-side, and are often used as ventilation grilles for shielded rooms, similar to high-SE enclosures. Like any aperture, a waveguide allows all its impinging fields to pass through when its internal diagonal (g) is half a wavelength. Therefore, the cut-off frequency of our waveguide is given by: $f_{cutoff}$=150,000/g (answer in MHz when g is in mm.) Below its cut-off frequency, a waveguide does not leak like an ordinary aperture (as shown by FIG. 1A) and can provide a great deal of shielding: for f<0.5$f_{cutoff}$SE is approximately 27 d/g where d is the distance through the waveguide the wave has to travel before it is free.

FIG. 1A shows examples of the SE achieved by six different sizes of waveguides below cut-off. Smaller diameter (g) results in a higher cut-off frequency, with a 50 mm (2 inch) diameter achieving full attenuation by 1 GHz. Increased depth (d) results in increased SE, with very high values being readily achieved.

Waveguides below cut-off do not have to be made out of tubes, and can be realized using simple sheet metalwork which folds the depth (d) so as not to increase the size of the product by much. As a technique, it is only limited by the imagination, but it must be taken into consideration early in a project as it is usually difficult to retro-fit to a failing product not intended for use in conductors should never be passed through waveguides below cut-off, as this compromises their effectiveness. Waveguides below cut-off can be usefully applied to plastic shafts (e.g. control knobs) so that they do not compromise the SE where they exit an enclosure. The alternative is to use metal shafts with a circular conductive gasket and suffer the resulting friction and wear. Waveguides below cut-off can avoid the need for continuous strips of gasket, and/or for multiple fixings, and thus save material costs and assembly times.

Gaskets are used to prevent leaky apertures at joints, seams, doors and removable panels. For fit-and-forget assemblies, gasket design is not tool difficult, but doors, hatches, covers, and other removable panels create many problems for gaskets, as they must meet a number of conflicting mechanical and electrical requirements, not to mention chemical requirements (to prevent corrosion). Shielding gaskets are sometimes required to be environmental seals as well, adding to the compromise.

FIG. 1B shows a typical gasket design for the door of an industrial cabinet, using a conductive rubber or silicone compound to provide an environmental seal as well as an EMC shield. Spring fingers are often used in such applications as well.

It is worth noting that the green/yellow wire used for safety earthing of a door or panel has no benefits for EMC above a few hundred kHz. This might be extended to a few MHz if a short wide earthing strap is used instead of a long wire.

A huge range of gasket types is available from a number of manufacturers, most of whom also offer customizing services. This observation reveals that no one gasket is suitable for a wide range of applications. Considerations when designing or selecting gaskets include: (1) mechanical compliance; (2) compression set; (3) impedance Over a wide range of frequencies; (4) resistance to corrosion (low galvanic EMFs in relation to is mating materials, appropriate for the intended environment); (5) the ability to withstand the expected rigors of normal use; (6) shape and preparation of mounting surface (7) ease of assembly and disassembly; and (8) environmental sealing, and smoke and fire requirements.

There are four main types of shielding gaskets: conductive polymers, conductively wrapped polymers, metal meshes and spring fingers. (1) Conductive polymers (insulating polymers with metal particles in them double as environmental seals, and have low compression set but need significant contact pressure, making them difficult to use in manually-opened doors without lever assistance. (2) Conductively wrapped polymers (polymer foam or tube with a conductive outer coating can be very soft and flexible, with a low compression set. Some only need low levels of contact pressure. However, they may not make the best environmental seals and their conductive layer may be vulnerable to wear. (3) Metal meshes (random or knitted) are generally very stiff but match the impedance of metal enclosures better and so have better SEs than the above types. They have poor environmental sealing performance, but some are now supplied bonded to an environmental seal, so that two types of gaskets may be applied in one operation. (4) Spring fingers ("finger stock") are usually made of beryllium copper or stainless steel and can be very compliant. Their greatest use is on modules (and doors) which must be easy to manually extract (open), easy to insert (close), and which have a high level of use. Their wiping contact action helps to achieve a good bond, and their impedance match to metal enclosures is good, but when they don't apply high pressures, maintenance may be required (possibly a smear of petroleum jelly every few years). Spring fingers are also more vulnerable to accidental damage, such as getting caught in a coat sleeve and bending or snapping off. The dimensions of spring fingers and the gaps between them causes inductance, so for high frequencies or critical use a double row may be required, such as can be seen on the doors of most EMC test chambers.

Gaskets need appropriate mechanical provisions made on the product to be effective and easy to assemble. Gaskets simply stuck on a surface and squashed between mating parts may not work as well as is optimal—the more their assembly screws are tightened in an effort to compress the gasket and make a good seal, the more the gaps between the fixings can bow, opening up leaky gaps. This is because of inadequate stiffness in the mating parts, and it is difficult to make the mating parts rigid enough without a groove for the gasket to be squashed into, as shown by FIG. 1B. This groove also helps correctly position and retains the gasket during assembly.

Gasket contact areas must not be painted (unless it is with Conductive paint), and the materials used, their preparation and plating must be carefully considered from the point of view of galvanic corrosion. All gasket details and measures must be shown on manufacturing drawings, and all proposed changes to them must be assessed for their impact on shielding and EMC. It is not uncommon, when painting work is transferred to a different supplier, for gaskets to be made useless because masking information was not put or the drawings. Changes in the painting processes used can also have a deleterious effect (as can different painting operatives) due to varying degrees of overspray into gasket mounting areas which are not masked off.

FIG. 1C shows a large aperture in the wall of the shielded enclosure, using an internal "dirty box" to control the field leakage through the aperture. The joint between the dirty box and the inside of the enclosure wall must be treated the same as any other joint in the shield.

A variety of shielded windows are available, based on two main technologies: thin metal films on plastic sheets and embedded metal meshes. (1) Thin metal films on plastic sheets, usually indium-tin-oxide (ITO). At film thicknesses of 8 microns and above, optical degradation starts to become unacceptable, and for battery-powered products, the increased backlight power may prove too onerous. The thickness of these films may be insufficient to provide good SEs below 100 MHz. (2) Embedded metal meshes, are usually made of a fine mesh of blackened copper wires. For the same optical degradation as a metal film, these provide much higher SEs, but they can suffer from Moiré fringing with the display pixels if the mesh is not sized correctly. One trick is to orient the mesh diagonally.

Honeycomb metal display screens are also available for the very highest shielding performance. These are large numbers of waveguides below cut-off, stacked side by side, and are mostly used in security or military applications. The extremely narrow viewing angle of the waveguides means that the operator's head prevents anyone else from sneaking a look at their displays.

The mesh size must be small enough not to reduce the enclosure's SE too much. The SE of a number of small identical apertures near to each other is (roughly) proportional to their number, n, (DSE=20 logn), so two apertures will make SE worse bar 6 dB, four by 12 dB, 8 by 18 dB, and so on. For a large number of small apertures typical of a ventilation grille, mesh size will be considerably smaller than one aperture on its own would need to be for the same SE. At higher frequencies where the size of the ventilation aperture exceeds one-quarter of the wavelength, this crude "6 dB per doubling" formula can lead to over-engineering, but no simple rule of thumb exists for this situation.

Waveguides below cut-off allow high air flow rates with high values of SE. Honeycomb metal ventilation shields (consisting of many long narrow hexagonal tubes bonded side-by-side) have been used for this purpose for many years. It is believed that at least one manufacturer of highly shielded 19" rack cabinets claims to use waveguide below cut-off shielding for the top and bottom ventilation apertures that use ordinary sheet metalwork techniques.

The design of shielding for ventilation apertures can be complicated by the need to clean the shield of the dirt deposited on it from the air. Careful air filter design can allow ventilation shields to be welded or otherwise permanently fixed in place.

Plastic enclosures are often used for a pleasing feel and appearance, but can be difficult to shield. Coating the inside of the plastic enclosure with conductive materials such as metal particles in a binder (conductive paint), or with actual metal (plating), is technically demanding and requires attention to detail during the design of the mould tooling if it is to stand a chance of working.

It is often found, when it is discovered that shielding is necessary, that the design of the plastic enclosure does not permit the required SE to be achieved by coating its inner surfaces. The weak points are usually the seams between the plastic parts; they often cannot ensure a leak-tight fit, and usually cannot easily be gasketted. Expensive new mould tools are often needed, with consequent delays to market introduction and to the start of income generation from the new product.

Whenever a plastic case is required for a new product, it is financially vital that consideration be given to achieving the necessary SE right from the start of the design process.

Paint or plating on plastic can never be very thick, so the number of skin-depths achieved can be quite small. Some clever coatings using nickel and other metals have been developed to take advantage of nickel's reasonably high permeability in order to reduce skin depth and achieve better SE.

Other practical problems with painting and plating include Making them stick to the plastic substrate over the life of the product in its intended environment. This is not easy to do without expert knowledge of the materials and processes. Conductive paint or plating flaking off inside a product can do a lot more than compromise EMC—it can short out conductors, causing unreliable operation and risk fires and electrocution. Painting and plating plastics must be done by experts with long experience in that specialized field.

A special problem with painting or plating plastics is voltage isolation. For class II products (double insulated), adding a conductive layer inside the plastic Cases can reduce creepage and clearance distances and compromise electrical safety. Also, for any plastic-cased product, adding a conductive layer to the internal surface of the case can encourage personnel electrostatic discharge (ESD) through seams and joints, possibly replacing a problem of radiated interference with the problem of susceptibility to ESD. For commercial reasons, it is important that careful design of the plastic enclosure occurs from the beginning of the design process if there is any possibility that shielding might eventually be required.

Some companies box cleverly (pun intended) by using thin and unattractive low-cost metal shields on printed circuit boards or around assemblies, making it unnecessary for their pretty plastic case to do double duty as a shield. This can save a great deal of cost and headache, but must be considered from the start of a project or else there will be no room available (or the wrong type of room) to fit such internal metalwork.

Volume-conductive plastics or resins generally use distributed conductive particles or threads in an insulating binder which provides mechanical strength. Sometimes these suffer from forming a "skin" of the basic plastic or resin, making it difficult to achieve good RF bonds without helicoil inserts or similar means. These insulating skins make it difficult to prevent long apertures which are created at the joints, and also make it difficult to provide good bonds to the bodies of connectors, glands, and filters. Problems with the consistency of mixing conductive particles and polymers can make enclosures weak in some areas and lacking in shielding in others.

Materials based on carbon fibres (which are themselves conductive) and self-conductive polymers are starting to become available, but they do not have the high conductivity of metal and so do not give as good an SE for a given thickness. The screens and connectors (or glands) of all screened cables that penetrate a shielded enclosure, and their 360° bonding, are as vital a part of any "Faraday Cage" as the enclosure metalwork itself. The thoughtful assembly and installation of filters for unshielded external cables is also vital to achieve a good SE. Refer to the draft IEC1000-5-6 (95/210789 DC from BSI) for best practices in industrial cabinet shielding (and filtering). Refer to BS IEC 61000-5-2: 1998 for best practices in cabling (and earthing).

Returning to our original theme of applying shielding at as low a level of assembly as possible to save costs, we should consider the issues of shielding at the level of the PCB. The ideal PCB-level shield is a totally enclosing metal box with shielded connectors and feedthrough filters mounted in its walls, which is in fact just a miniature version of a product-level shielded enclosure as described above. The result is often (called a module which can provide extremely high SEs, and is very often used in the RF and microwave worlds.

Lower cost PCB shields are possible, although their SE is not usually as good as a well-designed module. It all depends upon a ground plane in a PCB used to provide one side of the shield, so that a simple five-sided box can be assembled on the PCB like any other component. Soldering this five-sided box to the ground plane at a number of points around its circumference creates a "Faraday cage" around the desired area of circuitry. A variety of standard five-sided PCB-mounted shielding boxes are readily available, and companies who specialize in this kind of precision metalwork often make custom designs. Boxes are available with snap-on lids so that adjustments may easily be made, test points accessed, or chips replaced, with the lid off. Such removable lids are usually fitted with spring-fingers all around their circumference to achieve a good SE when they are snapped in place.

Weak points in this method of shielding are obviously the different variations of apertures such as the following: the apertures created by the gaps between the ground-plane soldered connections; any apertures in the ground plane (for example clearances around through-leads and via holes); and any other apertures in the five-sided box (for example ventilation, access to adjustable components, displays, etc.) Seam-soldering the edges of a five-sided box to a component-side ground plane can remove one set of apertures, at the cost of a time-consuming manual operation.

For the lowest cost, we want to bring all our signals and power into the shielded area of our PCB as tracks, avoiding wires and cables. This means we need to use the PCB equivalents of bulkhead-mounting shielded connectors and bulkhead-mounting filters.

The PCB track equivalent of a shielded cable is a track run between two ground planes, often called a "stripline." Sometimes guard tracks are run on both sides of this "shielded track" on the same copper layer. These guard tracks have very frequently via holes bonding them to the top and bottom ground planes. The number of via holes per inch is the limiting factor here, as the gaps between them act as shield apertures (the guard tracks have too much inductance on their own to provide a good SE at high-frequencies). Since the dielectric constant of the PCB material is roughly four times that of air, when FIGS. 1A-1E are used to determine via spacing, their frequency axes should be divided bye two (the square root of the PCB's dielectric constant). Some designers don't bother with the guard tracks and just use via holes to "channel" the track in question. It may be a good idea to randomly vary the spacings of such rows of via holes around the desired spacing in order to help avoid resonances.

Where striplines enter an area of circuitry enclosed by a shielded box, it is sufficient that their upper and lower ground planes (and any guard tracks) are bonded to the screening can's soldered joints on both sides close to the stripline.

The track which only has a single ground plane layer parallel, the other side being exposed to the air, is said to be of "microstrip" construction. When a microstrip enters a shielded PCB box, it will suffer an impedance discontinuity due to the wall of the box. If the wavelength of the highest frequency component of the signals in the microstrip is greater than 100 times the thickness of the box wall (or the width of box mounting flange), the discontinuity may be too brief to register. But where this is not the case, some degradation in performance may occur and such signals are best routed using striplines.

All unshielded tracks must be filtered as they enter a shielded PCB area. It is often possible to get valuable improvements using PCB shielding without such filtering, but this is difficult to predict. Therefore, filtering should always be designed-in (at least on prototypes, only being removed from the PCB layout after successful EMC testing).

The best filters are feedthrough types, but to save cost it is advantageous to avoid wired types. Leaded PCB-mounting types are available and can be soldered to a PCB in the usual manner. Then the leaded PCB mount is hand-soldered to the well of the screening box when it is fitted at a later stage. Quicker assembly can be achieved by soldering the central contact of the filter to the underlying ground plane, making sure that solder joints between the shielding box and the same ground plane layer are close by on both sides. This latter construction also suits surface-mounted "feed-through" filters, further reducing assembly costs.

But feed-through filters, even surface mounted types, are still more expensive than simple ferrite beads or capacitors. To allow the most cost-effective fitters to be found during development EMC testing, whilst also minimizing delay and avoiding PCB layout iterations, multipurpose pad patterns can easily be created to take any of the following filter configurations: (1) zero-ohm link (no filtering, often used as the starting point when EMC testing a new design); (2) a resistor or ferrite bead in series with the signal; ((3) is capacitor to the ground plane; (4) common-mode chokes; (5) resistor/ferrite/capacitor combinations (tee, LC, etc. see Part 3 of this series for more details); (6) feed-through capacitor centre-pin grounded, not truly feed-through) and; (7) feedthrough filter (tee, LC, etc., center-pin grounded, not truly feedthrough). Multipurpose padding also means the invention not restricted to proprietary filters and be created to best suit the requirements of the circuit (and the product as a whole) at the lowest cost.

In finding EMI/EMC solutions, the existing technology is inelegant and cumbersome. For example, the prior art uses spoons, which are these little projections with dimples in them that stick out; so that they go into compression and go opposite. One goes over the other so that they go together and they have to make physical contact. These structures bend and when one of them bends at a plane and they don't make contact anymore, they lose their electrical conduct. Then the prior art starts to have EMI leaks. They become tolerance nightmares and they're expensive. In addition, prior art manufacturing techniques designed to counter these problems requires forming the enclosure so that it has to have a tongue and groove or other prohibitive solutions.

SUMMARY OF THE INVENTION

The present invention removes the need for the single most expensive and least reliable aspect of the electro-mechanical packaging, which is the EMI gasket. The solution(s) provided by the present invention will eliminate the need for gaskets in a great number of applications, as well as "spoons" and other similarly troublesome structures in the PC Chassis. The present invention provides a configuration of a hard-drive covering system and method for manufacturing in which a polymer including an electromagnetic interference shielding (EMI shielding) is configured such that shielding gaskets may be reduced or eliminated completely. Patterned "cuts" into one or more sides of a disk-drive holder made of Premier® or another EMI shielding polymer material provides sufficient EMI shielding, having the result that shielding gaskets are not needed. In an alternate configuration of the invention, a computer box is provided with an inexpensive shielding solution.

BRIEF DESCRIPTION OF THE DRAWINGS

FIGS. 1A-1E illustrate various prior art electromagnetic interference shielding principles;

FIG. 4B is a close up the 2-D EMI shielding principle in a computer enclosure;

FIG. 8A illustrates sample details of the "female" partial spheres;

FIG. 8B illustrates a close-up view of the "male" partial spheres;

FIG. 9B illustrates the principle of the EMI shielding from in an assembled enclosure;

DETAILED DESCRIPTION OF THE DRAWINGS

Figure 5A:
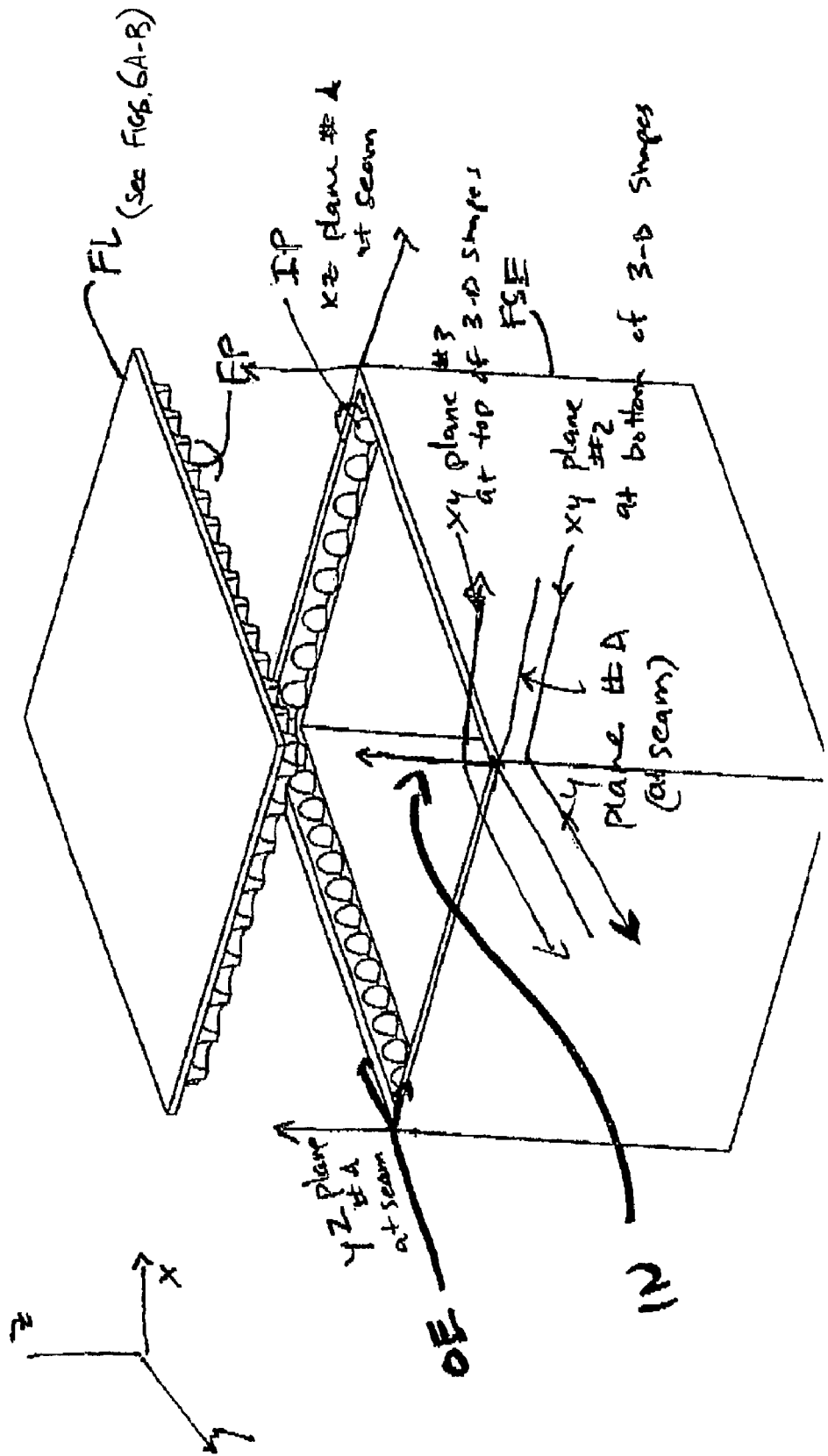
FIG. 5A illustrates a first embodiment of the present invention as it implements three-dimensional shapes.
Figure 5B:
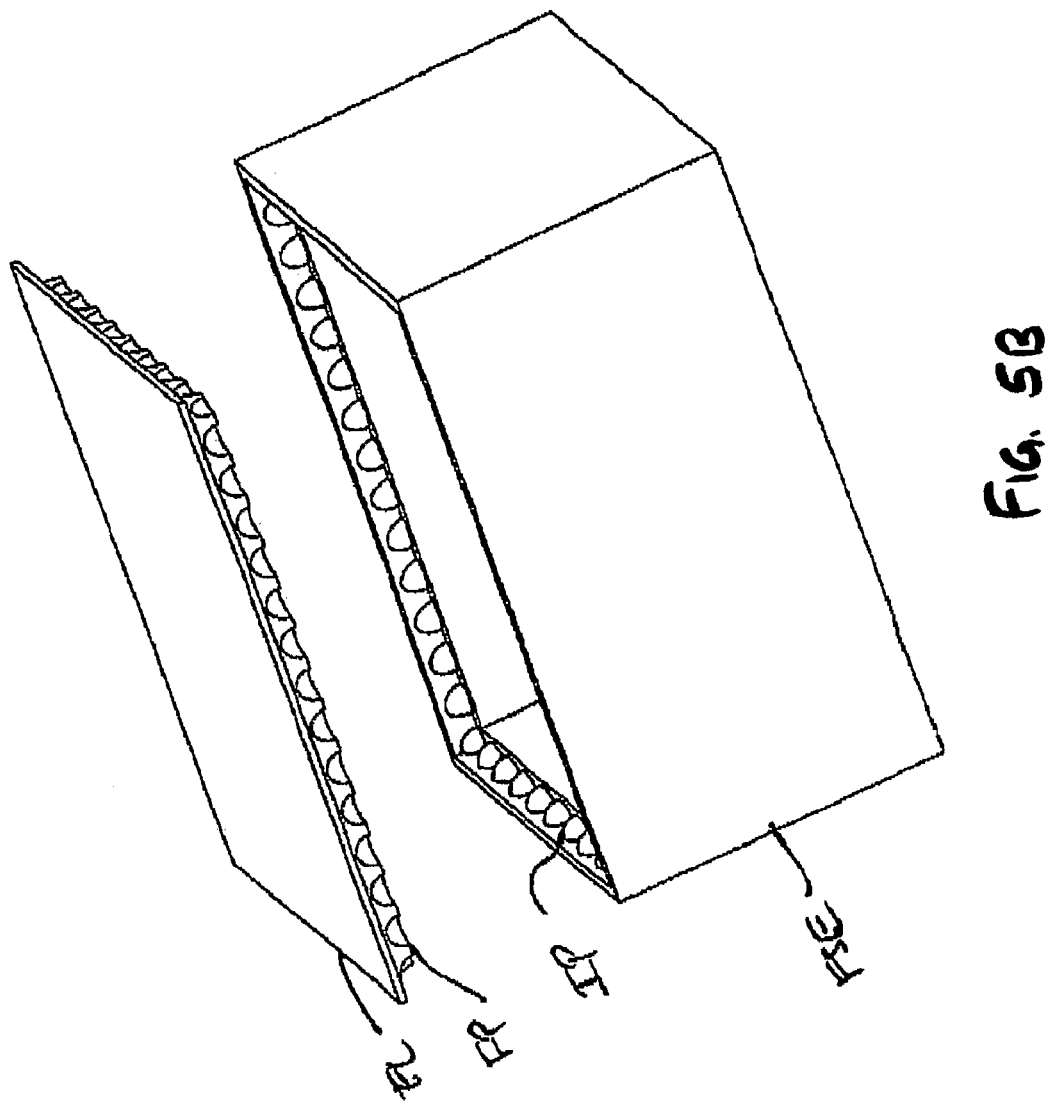
FIG. 5B illustrates the first embodiment of the present invention from a different angle.

With the "shell" or "scallop" embodiment of the invention, as shown in FIGS. 5A and 5B, the three-dimensional patterns are formed or otherwise configured such that they are generally going the inside periphery of the edges, and the two parts FSE and FL come together and the "sinusoids" meet. All that is necessary for the implementation of the three-dimensional implementation of the invention is to "cut" or stamp the edge of the metal and make the same Out and they come together with a "30 gap" or something similar. The advantages of the primary embodiment of the invention include, inter alia, the fact that there does not need to be any contact and therefore no degradation over time (see FIG. 9B). The parts FSE and FL don't have to make physical contact. Further advantages include that there are no tolerances to consider and there is nothing to deform.

Referring again to FIG. 5A, a first embodiment of the three-dimensional EMI shielding solutions for electronics enclosures is shown from a side-angled view. The first embodiment takes advantage of the manufacturing ease of using a two-part enclosure including a five-sided enclosure FSE with an interior volume IN for housing electronics and a flange FL, which fits into the five-sided enclosure upon completion.

Referring again to FIGS. 5A-5B shows a top view of a three-dimensional box in a two-part embodiment of the three-dimensional solution (A three-part embodiment of the invention is discussed briefly below). In this particular embodiment, either the box or the flange could be molded or cast, and thus "three-dimensional tortured path" or a TORTURE CHAMBER™ is illustrated. In general, the electromagnetic interference cannot get in or out of the electronic enclosure. In the preferred embodiment shown in FIGS. 5A and 5B, there is a (periodic) quarter sphere with a half cylinder-type shape IP, although, as can be appreciated by those skilled in the art, many other types of shapes would be sufficient for providing the necessary shielding, and some are briefly discussed below. In the illustration, the female three dimensional shapes FP in the "lid" or flange FL or mate with the male protrusions IP along the perimeter of the lid at the lid-to-box interface OE, which is generally the XY plane formed at the seam of the junction between the lid and the box (not shown), labeled as plane XY(#A).

Even though there can be adequate spacing between the box FSE and the lid/flange FL, the shielding is provided well inside the allowable for the frequency that are generally desired for shielding.

As shown in FIGS. 5A and B, the three-dimensional EMI-shielding solution includes an interior pattern IP of three-dimensional shapes which are stamped, cut, molded, extruded or otherwise configured into the five-sided enclosure FSE around the perimeter of the top or open edge OE. FIGS. 5A and 5B show the interior pattern IP as being semi-spherical and "male" or protruding into the interior volume IN, however, in other embodiments the shapes could be reversed or "female" without necessarily departing from the spirit of the invention. FIGS. 5A and 5B show that the flange FL also includes a pattern that is "complementary" to each other such that the box and the phalange will seamlessly fit as well as provide sufficient EMI shielding.

The half-wave resonance of slot antenna, expressed in the above rule of thumb, is the basis for the solid line in FIG. 1D (and for the rule-of-thumb of FIG. 1E) using the relationship: SE=20 log($\lambda$/2d). Therefore the degradation associated with a multiple hole pattern is given by: SE reduction=10 log(N), where N=the # of holes in the pattern. Using the relationship: f·$\lambda$=c, where is c the speed of light: $3 \times 10^8$ m/sec, the frequency in Hz, and $\lambda$ is the wavelength in meters, where: f=the frequency of the wave $\lambda$=the wavelength, c=the speed of light.

Shielding is the use of conductive materials to reduce EMI by reflection or absorption. Shielding electronic products successfully from EMI is a complex problem with three essential ingredients: a source of interference, a receptor of interference, and a path connecting the source to the receptor. If any of these three ingredients is (missing, there is no interference problem. Interference takes many forms such as distortion on a television, disrupted/lost data on a computer, or "crackling" on a radio broadcast. The same equipment may be a source of interference in one situation and a receptor in another.

Currently, the FCC regulates EMI emissions between 30 MHz and 2 GHz, but does not specify immunity to external interference. As device frequencies increase (applications over 10 GHz are becoming common), their wavelengths decrease proportionally, meaning that EMI can escape/enter very small openings (for example, at a frequency of 1 GHz, an opening must be less than ½ inch). The trend toward higher frequencies therefore is helping drive the need for more EMI shielding. As a reference point, computer processors operate in excess of 250 MHz and some newer portable phones operate at 900 MHz.

Metals (inherently conductive) traditionally have been the material of choice for EMI shielding. In recent years, there has been a tremendous surge in plastic resins (with conductive coatings or fibers) replacing metals due to the many benefits of plastics. Even though plastics are inherently transparent to electromagnetic radiation, advances in coatings and fibers have allowed design engineers to consider the merits of plastics.

As a specific example, considering the FCC regulation to shield up to 2 GHz, a typical maximum clock speed in many of the controllers in the enterprise networks would be 400 MHz. If you consider the 2 GHz value as the maximum frequency of interest, then at 400 MHz, the user will shield up to and including the 5th harmonic of a 400 MHz signal . . . i.e. 400 MHz*5=2 GHz (shielding to the 5th harmonic of maximum clock speed of 400 MHz).

To determine the wavelength at 2 GHz, utilize equation C, above: $f \cdot \lambda = c$, $\lambda = c/f$ $\lambda = (3 \times 108)/(2 \times 109\lambda) = 0.15$ meters (at 2 GHz). Terms A & B are of interest regarding the determination of a longest possible slot length $\lambda/2 = 0.075$ m or 75 mm. It is recommended that the apertures be kept to a range of approximately $\lambda/20$ to $\lambda/50$, therefore for 2 GHz, the apertures should be in the range of: $\lambda/20 = 0.0075$ meters or 7.5 mm maximum @ 2 GHz; $\lambda/50 = 0.003$ meters or 3.0 mm minimum @ 2 GHz.

Looking to equation from above, the shielding effectiveness for 1 hole of maximum length "X": $SE = 20 \log(\lambda/2d)$ (there is no minimum—the smaller the better—this equation is used as a practical value for packaging.) @ 3 mm->SE=20 log(0.15/(2·0.003))=20 log(25)=28 dB' @ 7.5 mm->SE=20 log(0.15/(2·0.0075))=20 log(10)=20 dB.

Therefore, in a standard application there are multiple holes—for example, a perfed 0.060" thick steel faceplate SE reduction=10 log(N) has a hole pattern comprised of 100 holes and an SE reduction=10 log(N)=10 log(100)=20. The result is the reduction of the shielding to zero in the case of the 7.5 mm holes and the reduction of the shielding to 8 dB in the case of the 3 mm holes.

Figure 1A:
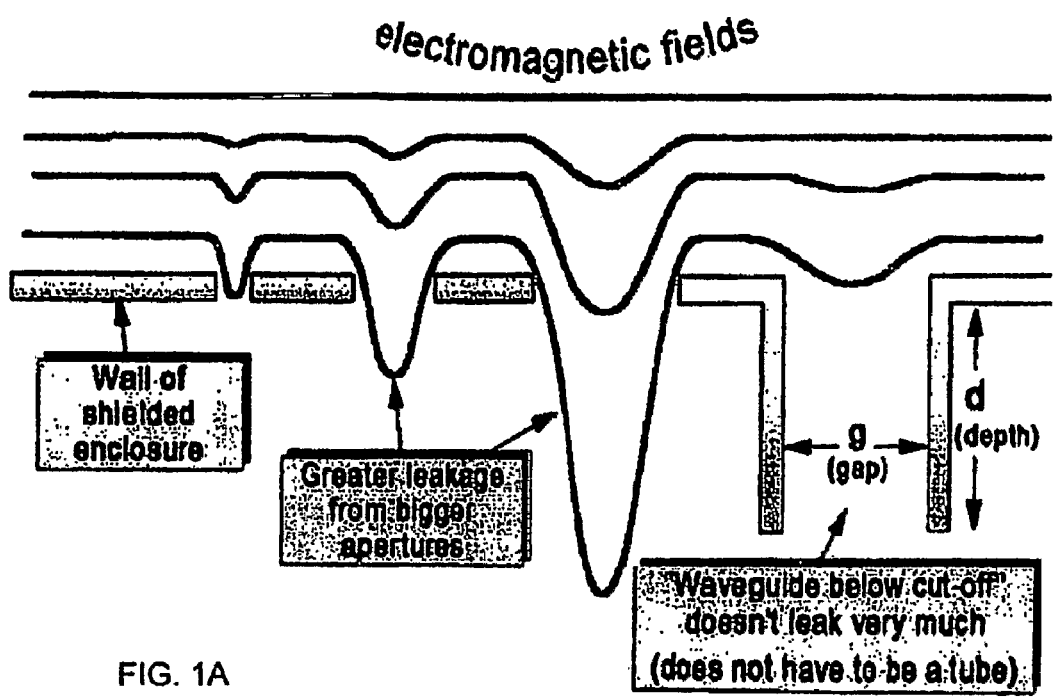

This is where the restrictive nature of EMI emerges and the interplay between getting cooling air in without letting magnetic interference out becomes more significant. One of the principles upon which the invention takes advantage of is illustrated by FIG. 1A.

It is recommended that most packaging applications provide ~15 dB of shielding at the enclosure level. As is evident from the above information, this is far from easy to accomplish without an advance in the technology. It should be noted that the degradation described above does not even consider all the losses at seams where the gaskets are actually used. This is only the perf for airflow.

In the two-dimensional solution for EMI shielding is shown for enclosures that are generally in the shape of boxes and other types of cabinets for computers) and other electronic components that require EMI/EMC shielding. Referring to FIG. 1A, a principle the wall of enclosure is shown which is the wall of a shielded enclosure made of a conductive material, with the greater sizes of apertures causing a greater amount leakage of the electromagnetic fields. In an embodiment of the invention known by the trade name of "TORTURED PATH™" the improvement reduces the size of apertures by strategically cutting, forming, molding, extruding, stamping and forming any manufacturing method which utilize an electromagnetically conductive material in basically any application.

The present invention provides a less expensive EMI shielding solution than the way the current technology is implemented. This can be accomplished in various embodiments of the invention implemented "two" dimensions (namely two-dimensional considerations since nothing literally takes place in only two dimension) With sheet metal or flat extruded cut or stamped materials. The material could be cast, again, with a thin sheet metal—assuming that the structures cast, cut, or extruded are thin relative to the Overall dimensions, considering that the so-called two-dimensional considerations have finite thickness. As the manufacturing goes into a molding process or casting, it creates a more even three-dimensional shape or forms metal out of the 2D planes and uses drying techniques to create overlaps and further "torture the path." Thus, a goal of this particular embodiment of the invention is to create small apertures. More particularly, the goal of this embodiment is to create apertures that are not only small but force the electromagnetic noise to change directions or to go through apertures that are small and make the path difficult for the EMI to find its way out (thus, the "tortured path"). This, of course, reciprocally applies to the susceptibility of the electronics inside the enclosure to electromagnetic interference from the outside as well. EMI, electromagnetic inference generally refers to what is projected outwards to the world and how it might interfere with other devices. However, for the purposes of this disclosure, the expression "EMI" also includes shielding from any devices that are external to the user and that are radiating electromagnetic fields which will cause interference on the product and this is where the user would be susceptible to EMI.

Figure 2:
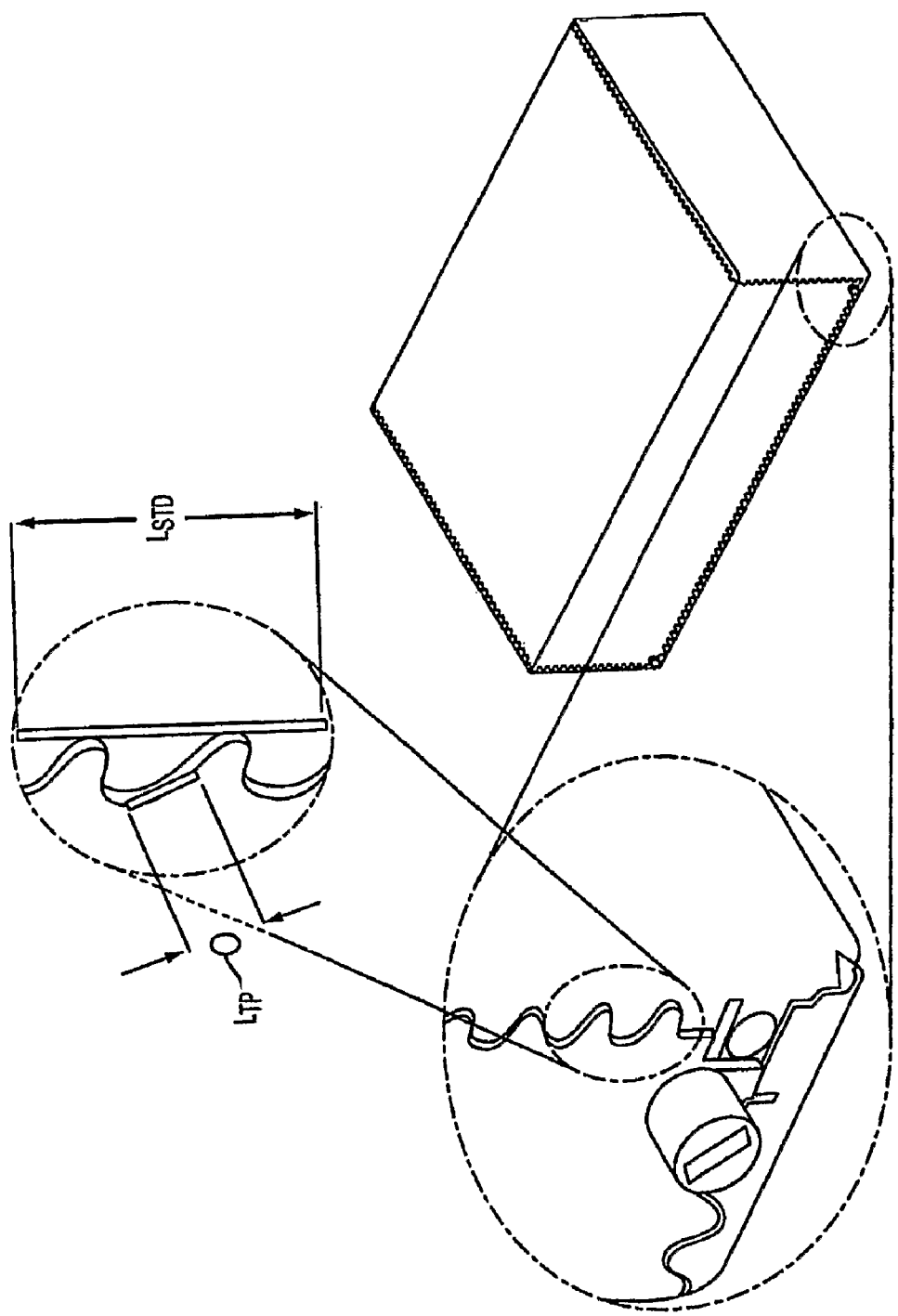
FIG. 2 illustrates a sample pattern in an enclosure as may be implemented in the invention that embodies the principle of "effective length;" in the two-dimensional EMI shielding solution.
Figure 3:
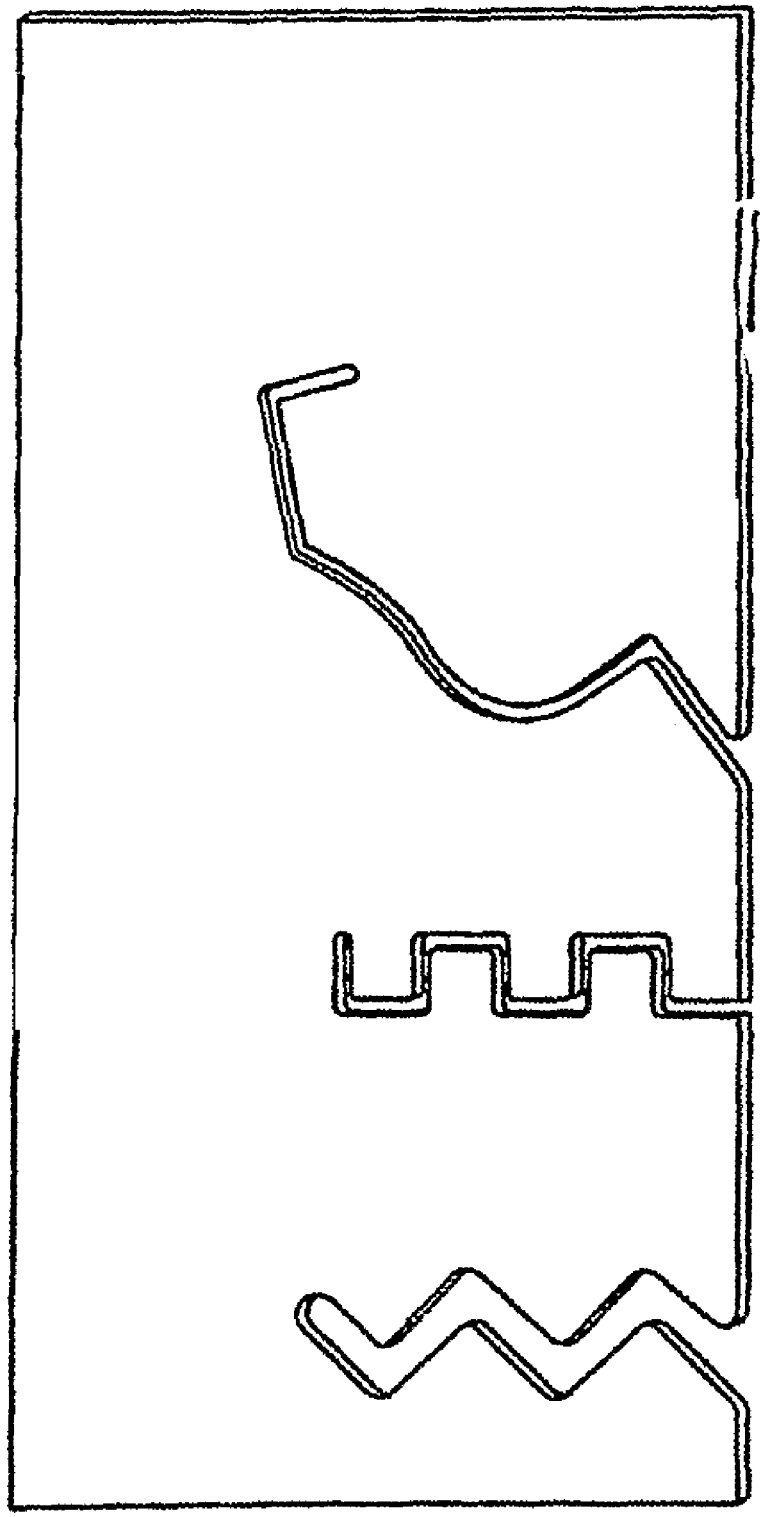
FIG. 3 illustrates a side of a computer enclosure in another embodiment of the invention, or three cuts in the "four-cut" or TORTURED PATH™ solution.

Wave guides are discussed above in FIGS. 1A-E, in which the depth of a channel or depth of an aperture causes an increased difficulty for the electromagnetic wave to get out for any given aperture size. The TORTURED PATH™ invention is implemented in a mold or a cast to create a three-dimensional pathway that does not allow to escape or enter the enclosure, which may include a wave guide effect. But, again, the preferred and conceptually most effective tortured path for the EMI is a sinusoidal saw-tooth square wave, as shown in FIG. 2, but also may be any kind of irregular shape, as shown in FIG. 3 whether the pattern is periodic, periodic and changing, or constantly changing in shape. However, the invention requires that the pattern not allow for the maximum aperture size to be sufficient for the electromagnetic waves to traverse through the material, whether it is inward or outward. This principle of the invention is shown in FIG. 2 as "effective length matters."

Figure 1B:
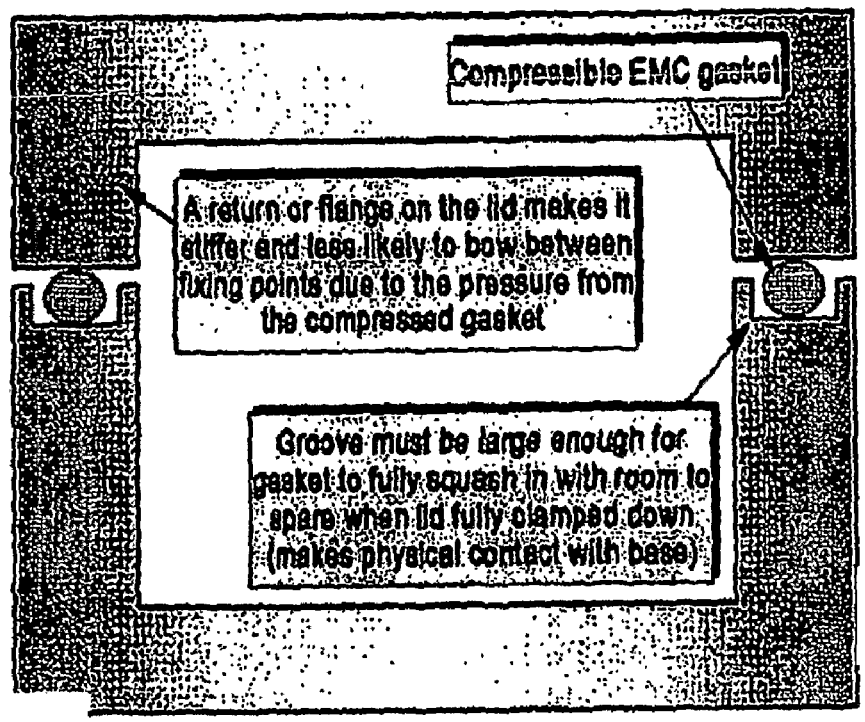

Prior art illustration FIG. 1B shows a phalange which is used like a channel with a gasket. This channel is in the base of a box or an enclosure and then filled with a gasket—a circular gasket in this case is a very common approach. Then a lid is applied that forces that gasket to deform and it will partially conform into the channel thereby forming a seal. If this "tortured path" concept is considered, as is seen in the illustrations of the present invention discussed below where a three-dimensional example is shown, the gasket can be partially or fully avoided by molding, casting, or machining a shape in which the top fits into the bottom. However, the fitting procedure generally includes more than the simple wave guide effect as shown in the prior art.

The invention uses the so-called "tortured path" feature in concert with or uniquely to create a shape that reduces the aperture size by improving the configuration of the metals fit together in particular configurations that provide the desired EMI/EMC shielding. In a preferred embodiment, shown in FIGS. 5A-14, discussed below, a particular configuration uses sinusoidal three-dimensional scallops that are shaped in two dimensions and then shaped again into the orthogonal planes. The orthogonal planes have sweeping Shapes that force the EMI to traverse through narrowed apertures for the use of shaping. Therefore, since the material around the chassis, (which must be electromagnetic conductive material because the EMI/EMC shielding won't work if it's not) shielding has to be in contact with an electromagnetic conductive material. Using a conductive material with this configuration means that the wave is trying to get through an aperture that is too small for it to emit or receive waves of a given frequency. Changing the shape of the cuts, it is possible to do that again in concert with either the wave guide, a seam that is a tongue and groove or a stamp so that you have an interlocking or with metal that's hem-on-hem. But instead of just having the hem interlocking, this "tortured path" shape is created and fits them into each other with male and female opposing images with a gap. This does not require the invention to have tight tolerances because this gap can be relatively small compared to the allowable aperture size, but very large compared to the allowable tolerances. Because of this particular feature of the present invention, 100% reliability on assembly is possible.

Additionally, 100% reliability is possible in the performance with particular embodiments of the invention, because the medium is not vulnerable to compression or degradation over time. Additionally, there is not any material used as a gasket that will be ripped off and sheared, nor is there a gasket that will plastically deform. Beryllium copper, for example, can plastically deform. Additionally, any metal gasket, finger gaskets or finger stock can either deform through improper design or improper handling, whether that be in shipping or other in situations. Instead, by creating cuts or through two or three-dimensional cuts that control the EMI as a way to control the aperture size, there is nothing to deform. Furthermore, in the present invention, there is no requirement for physical contact, therefore there are no tolerance issues, deforming issues, no degradation over time and no environmental impact. There are no loose structures added. The invention provides an extremely cost effective EMI shielding solution because there are no added parts, no fasteners and no welds. Free-plated material may be used everywhere which are formed in the case of sheet metal, stamp and form and/or a few rivets which do not depend on contact which have no degradation over time and no environmental impact.

Figure 1C:
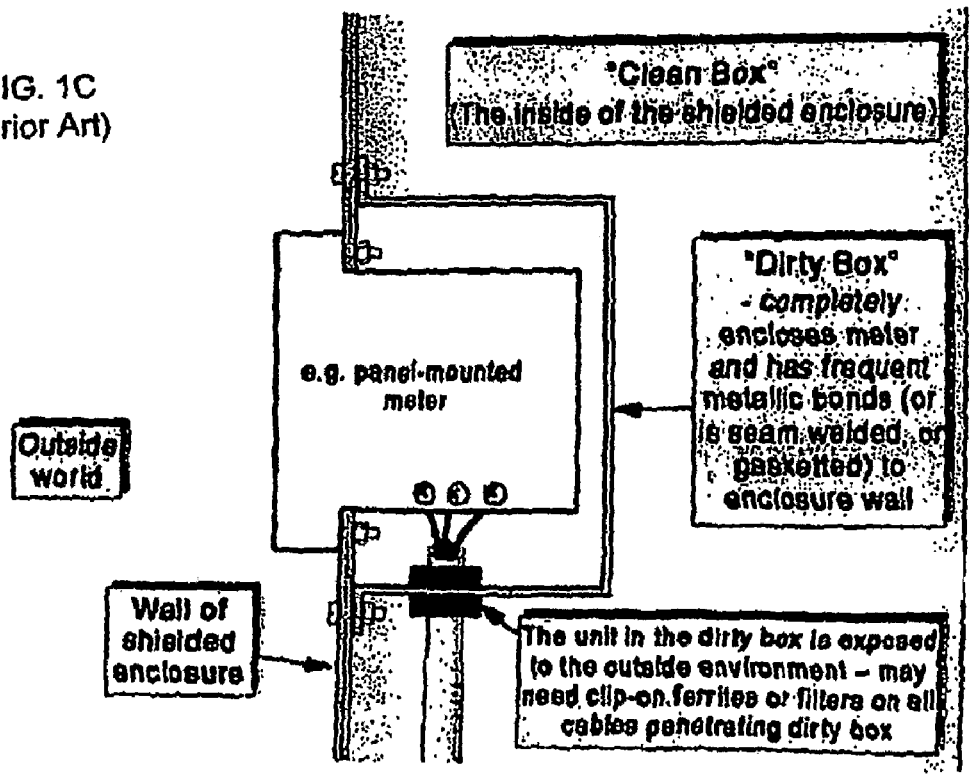

A prior art panel mount FIG. 1C, is shown as seen through a box or through the face may be adapted to particular embodiments of the present invention. With the preferred embodiment of the tortured path invention, this may be generally efficiently created, for example, with a panel mounted meter as shown. On the backside of the phalange that mates to the chassis, which adapts the prior art to implement the present invention by adding the TORTURED PATH™ shape on a plate behind the phalange. In the case of sheet metal, another piece of sheet metal can be used behind the flushed phalange that would be a ninety-degree rectangular shape on the front, which would also allow for aesthetically appropriate or pleasing patterns. Behind, the cut materials, sinusoidal, saw tooth, square waves, would fit into an aperture, again, of the mating shape with appropriate tolerances approximately 20-30 thousandths of an inch in a gap that follow the shape. Then, the negative of that shape would follow around and would just overlay on top of one another into the same plane. There would be just this gap of whatever shape was selected, reducing the effective length all the way around the perimeter and containing the EMI and provide sufficient shielding.

Referring now to FIG. 1E a diagram of the relationship between frequency and gap size is shown. As the frequency of the electromagnetic noise goes up, the allowable aperture size goes down in order to have adequate shielding. Obviously as the frequency goes up, it is necessary to have smaller and smaller gaps. In this way, tortured path, if the sinusoid was used, for example, the wavelength may be shortened and the amplitude lowered in order to create a gap appropriate for a given frequency. It works well because it is below the allowable half wavelength of the range which is typical for shielding applications. For example, at a range of land over 50 to lambda which is over 20 wavelengths at a given frequency, divided by 20 to 50 in that range. As an example, the FCC regulates up to two gigahertz and in that range, it's lambda over 50 equals three millimeters, land being equal to 0.15 meters or 150 millimeters. Divided by 50, it's three millimeters and divided by 20 is 7½ millimeters. Even in the case of sheet metal where you have bends and other abnormalities of shape, it is still easy to manage all tolerances of bends with a $30,000^{th}$ gap, which would give basically 100% reliability on assembly but only be $30,000^{th}$ wide. Additionally, if such a situation is compared to three-quarters of one millimeter, such that there is a wave that's three or four times this size, it still stays within the three-millimeter range at four times that size. Such a gap would not allow the adjacent peaks or valleys of that wave to be seen, so the effective length would basically be the traverse; the traverse would go not quite from peak to peak but partway from the peak to part way to the valley, sort of down the transition from peak to valley in the wave and still well within the three millimeter requirements.

Very short wavelengths or very small aperture sizes are allowed in this way but do not require anything other than a stamp and a form. In a case of a mold, it is possible to run that much tighter. It may be narrower than 30,000, in sheet metal. That's very generous and it makes an almost perfect assembly. It is possible to reduce it to 10 or 15 thousandths and there would be no issue. This remains true if all of the cuts are retained so that they're not visible and, if it's not exactly the male and female, which don't fit exactly following each other, as long as they stay within that gap, it may be slightly irregular. For example, one peak might be a little close to the valley, but it won't cause interference and, perhaps it could even cause an intermittent contact which might enhance the electro-conductivity.

FIG. 1E refers to the shielding effectiveness versus the frequency. Therefore, if you look at a 10 millimeter gap, for example, it's showing that 20 decibels of shielding with a 10 millimeter gap at one gigahertz are possible, approximately. For most electromagnetic packages, in the case of a sheet metal enclosure, it is rare that a sheet metal enclosure will produce more than 20 DB of shielding the enclosure. In this one example, a 10-millimeter slot will provide 20 DB of shielding at one gigahertz. In this case, the sign waves easily constrain the gap to be anywhere half of that size. At half that size, at one gigahertz, based on this chart, it might be up to about 35 DB, which is significantly above the shielding of any normal chassis. Now, of course, that's based on one aperture. Therefore, it may be necessary to degrade that by the 10 law again, where N is the number of total apertures. But it takes 100 apertures—the 10 law again—to have a 20 DB degradation in shielding. So with a five-millimeter slot, which we could easily provide, one gigahertz, would be about 30 DB of shielding. So even with 100 of those, there would still have 10 DB of shielding; there are many enclosures that exist that don't have far in excess 10 DB of shielding. Certainly, in consumer desktop PCs that is what would be expected more often than not in the chassis. So, again this invention proposes a solution with no gaskets, no screws, no fasteners, and just a few rivets and with basically no degradation of performance over time and with no compression set, only a gap.

Referring now to FIG. 2, the first model of the EMI shielding principle in a two-dimensional application of the invention as shown in "effective length," a model is shown where the LSTD is the old standard length of a slot. If it was a straight slot, that gap would be, as shown, compared to length of the EMI-shielding path, which is the longest straight line distance that the electromagnetic interference can "see" through the sinusoid. The length standard and the strength slot would be somewhere in the order of eight to 10 times the length of the EMI shielding path. FIG. 3A shows a couple examples of the different types of shapes. You see a triangular sawtooth-type cut configuration. Again, just do not allow the wave to be able to see by the peaks so it will look for the straightest line it can find. So it's just tortured in that it cannot see around the corners. And then you see a square wave and then you see a very odd bent paperclip-looking shape wave, a cut. You can use any cut you can imagine. What you're trying to do is reduce the effective length of any slot that can be used as antenna by the electromagnetic interference. So this can be used around IO [sounds like] devices. This can be used in sheet metal. This can used in extruded cuts, molded, casted cuts in any shape, whether it's used in sort of a modular into a chassis, around the back phalange of a model, whether it's around the input/output devices, in any manufacturing method, any electromagnetically conducted materials for which EMI needs to be contained. Torture the path—EMI, reduce the effective length by strategic cut shapes or molds or extrude shapes and, in addition, go into a three dimensional through drawing and overlapping, again, torturing the path. In concert bringing together a wave-guided effect, but, again, the tortured path is the essence of this concept and it can easily be brought to bear with complementary forming techniques or molding techniques that don't add costs, or increase manufacturing complexity.

FIG. 3A illustrates a two-dimensional EMI shielding embodiment of the invention. Three cuts are shown in various shapes in the illustration, and four are used in a first type of the alternate embodiment. However, the cuts may all be of one type of mg, in appropriate patterns, such as sinusoidal, square wave, and certain so-called Brownian-motion type cuts. The two-dimensional EMI shielding solution provides a potentially complete EMI shielding solution in alternate embodiments as long as the four lines are placed to prevent any "snaking" of the sinusoidal wave propagation WP. FIG. 3A shows a couple examples of the different types of shapes. A triangular saw tooth-type cut configuration is shown TST. Again, the wave(s) are not able to seen by the peaks so it will look for the straightest line it can find. So it's just "tortured" in that it cannot "see" around the corners. The square Wave SW is then seen and then a very odd bent paperclip-looking shape wave MWC cut is also shown. As can be appreciated, other types of cuts can be used. The goal is to try to reduce the "effective length" of any slot that can be used as antenna by the electromagnetic interference. So these cuts can be used around I/O devices. This can be used in sheet metal as well as can be used in extruded, molded or casted cuts in any shape. The invention may be applied, such that it is used in a modular into a chassis or around the back phalange of a model. It may be used around the input/output devices, in any manufacturing method or in any electromagnetically conducted materials for which EMI needs to be contained. The TORTURED PATH™ solution reduces the effective length by strategic cuts, shapes or molds or extruded shapes and, in addition, goes three-dimensional through drawing and overlapping, again, torturing the path. Even bringing together a wave-guided effect, The TORTURED PATH™ is the essence of the invention and it can efficiently be implemented in the present invention with complementary forming techniques or molding techniques that don't require additional costs.

Illustrating how effective this principle is and how versatile the manufacturing applications are, FIG. 3B shows that the sides of an alternately cut computer enclosure can have any number of non-periodic patterns NPP along the seams of the enclosure ENC to create the improved EMI shielding.

Implementing the "effective length" principle to make a two-dimensional EMI shielding solution, is a stamp and then a subsequent form or stamp which is brings the male and female image of these two slots together. This is achieved alternately with a small width and large width so the smaller male fits inside the larger female, back and forth, whether that's saw-tooth, square wave, sign wave or some intermittent pattern of those and other shapes. As shown, it is possible to reduce that effective length economically and efficiently at virtually no cost.

Figure 4A:
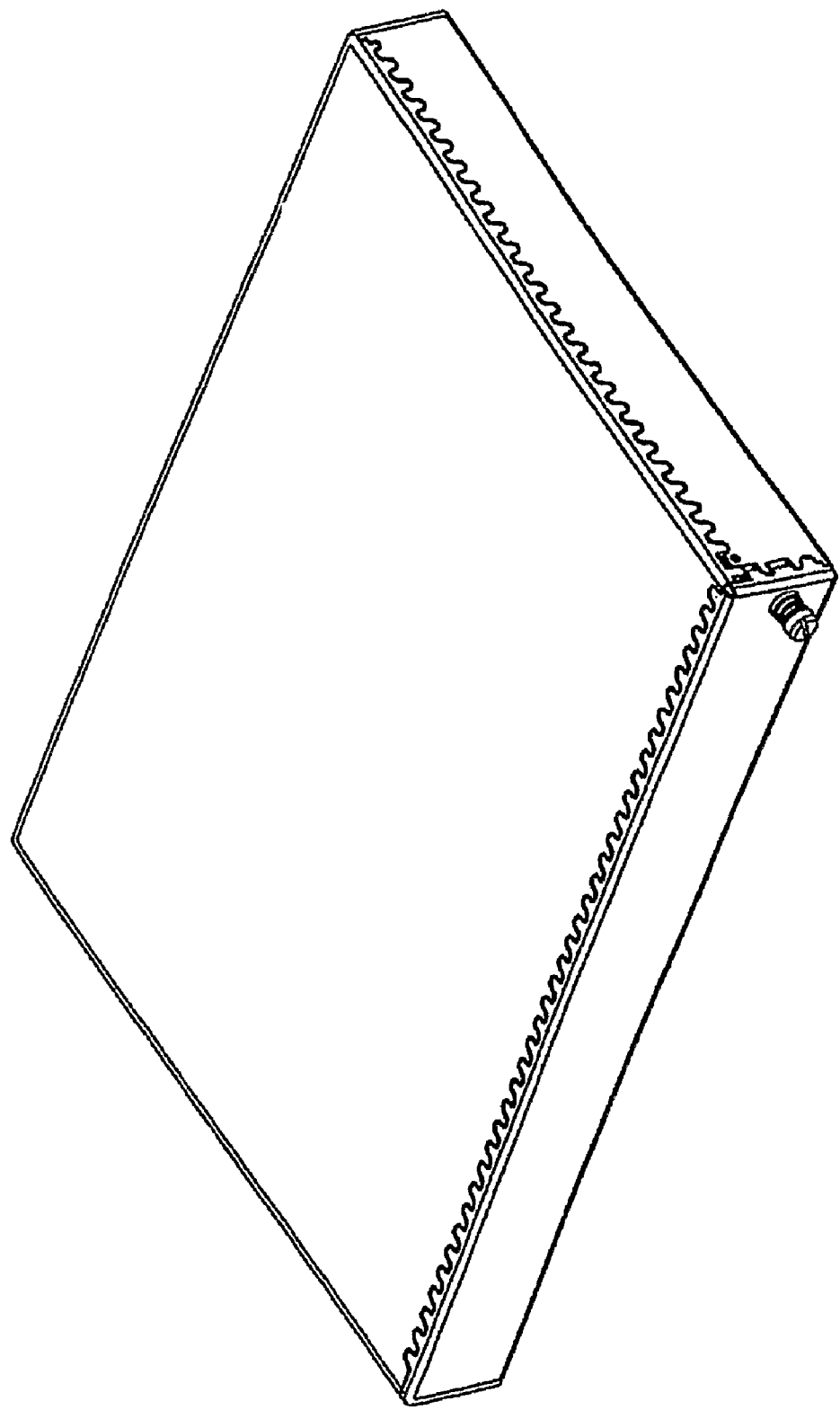
FIG. 4A illustrates a two-dimensional embodiment of a computer enclosure from a top-side view.

FIGS. 4A-4D illustrate an embodiment of the two-dimensional EMI shielding aspects as were introduced in US Patent Publication No. 2005-205209 (U.S. application Ser. No. 11/012,896) and U.S. application Ser. No. 11/080,385, which are all hereby incorporated by reference, for all purposes. FIG. 4A is a top angle view of a first example or embodiment, a three-sided and three-sided bar where the one three-sided fitting is down over the other and it comes straight down from the top. Then, the EMI/EMC is just deflected in front and back in order to overcome any interference between the sign waves. So it is possible to bring the two U-sections together, having The TORTURED PATH™ seam running along six different edges to bring the two three-sided boxes or sections together.

FIGS. 4A and 4B illustrate a sample of a two-dimensional "generic" "one-hit" solution embodiment of the invention for PC enclosures and other "boxes" that provide a great deal of advantage in the manufacturing process over current methodologies.

Other embodiments of the invention can include end-use, assembly and other manufacturing considerations such as using the "three-and-three" configuration (not shown). A 4-side component of model #3 of a preferred embodiment of the invention which can be used in a "4×1×1" or "4×2". The 4-sided component is generally manufactured with the sinusoidal pattern on each of the edges, but can include other patterns as discussed in FIG. 3. In the two-dimensional EMI shielding embodiment, the phalanges all come down from the top to the sides and back. So when the lid is off, there may be a wide-open exposure to fully populate the inside of the box without any interference, with none of the top view looking downwards covered by any material whatsoever. There is therefore full access to the box. In addition, this could also be done as a four side and a two side where the top was included as part of the whole front. This could also be done in a two-part assembly instead of three. In the case of a "5×1 type" of the embodiment, this configuration is very straightforward. This embodiment may also be implemented in it is a two-part assembly and a 3×3 channel box which is also a two-part assembly.

In most embodiments of the two-dimensional EMI shielding computer enclosure applications of the invention, the invention requires a simple stamp or cut and form fabrication in sheet metal (for that particular embodiment). The invention is less expensive than "spoons" and does not require physical contact which therefore provides greater reliability.

Referring again to FIG. 4A, a model of the preferred embodiment of the computer enclosure configuration is shown. An example of a one RU 17½ inch wide chassis, approximately 11½ inches deep, which would represent a classic kind of Configuration for a standard 19 inch rack, 17½ inches wide allowable and one RU in height. The TORTURED PATH™ seams run along the sides. This is a front isometric view, looking at the front right-hand corner in the foreground. The seams would run along the top of both sides, the top of the back, down both back vertical corners near the corner, but on the backside. All four sides are around the faceplate, but none show on the front section at all. So aesthetically, no apertures are in the front, although aesthetically these could be enhancing at some point and that's something that may be discussed.

Such apertures could be used ergonomically, aesthetically or they could be used to cut the logo of a company, if done properly. They could also be used for implementing TORTURED PATH™ shapes to create air inflow in a manner which would help to control the EMI. So in the particular enclosure illustrated in FIGS. 4A and 4B, there is a four-sided base where in the flat pattern configuration, it would be a four-sided box. It would have a TORTURED PATH™ shape around the perimeter of all four sides. In between the back and the two side sections, which could be phalanged over, it would fold up and phalange the sides into the back panel. Fastening requires only a rivet is in each, and optionally a rivet in each of the back corners. Thus, the process would be stamp, form, and two rivets for the total assembly and no gaskets, no welds, no screws, which could all be done in pre-plate material.

FIG. 4A also illustrates the preferred embodiment with a separate lid that comes down that goes over the back and both sides, again, with the TORTURED PATH™ assembly. These particular configurations allow for easy addition of joining tabs in order to rivet the top to the base or it can use a counter-sunk screw, avoiding "intermittency" problems from a standpoint of electromagnetics which could also augment the electromagnetic advantages of the present invention. This is contrast to a standard enclosure situation with a straight slot where it's necessary to have the screws at the same spacing as the maximal allowable aperture. With this configuration of the present invention, the spacing might augment the TORTURED PATH™ EMI/EMC shielding solution and also be used for structural integrity and/or be just for the enclosure to maintain the enclosure.

In the configurations shown in FIGS. 4A and B, the nose or the front faceplate goes over all four sides and can be tapped and can control it. In this way, it is possible to actually put the lid down in a configuration where it is actually hooked rotating, in a tongue and groove kind of hook. It is possible to bring it down and capture all the assembly strictly with the faceplate. Basically, there would then be a stamp, a form, a friction fit and then just the lid would be captured. The sides and the base would be captured by the nose cone. In this way, the entire assembly is brought together. While such a process may not provide all the structural integrity that was needed for all end-uses, in many cases it would certainly be adequate. There are many configurations for which this could be done. The EMI can be contained and basically element fasteners eliminate welds and gaskets at a very low cost and additionally provide thermal enhancement. So it would therefore be additionally cost reductive and, thermally enhanced because of the ability to now open up more apertures and would be environmentally friendly, without any addition there. One hundred percent of this is assemble-able and 100% reliable with no degradation over time. There's a simple captive. It could be quarter term, but in this case, a simple captive—spring loaded screw that can be taken into a pem-nut on the back of a phalange is pivoted off of the side wall. One of those is at the front and both ends of the chassis where there may a split shear on the one site and just the positive locking on the other.

Aesthetically, the pattern cut along the seams TPS on the front are required. Then from above, a side view is shown as it runs along the top and down the front side edge. This illustration demonstrates the rotational fastener which has the captive fastener for mounting the box. It could be a positive quarter-turn lock in which a paddle that goes behind a phalange. A simple screw or any manner in which was most appropriate perhaps a latching device could be used without departing from the spirit and scope of the invention. The enclosure system can range from the very simplistic assembly approach which is cost effective while providing high reliability and excellent from a minimization of assembly cost with virtually no assembly or welding. This can be done with any material in any manufacturing method—any electromagnetic conductive material and any manufacturing method. In cast, molds, etc., a three dimensional tortured path is possible, just by simply molding or casting. In an extrusion, The TORTURED PATH™ is cut into a shape as it is extruded and used for airflow and EMI container.

Figure 4C:
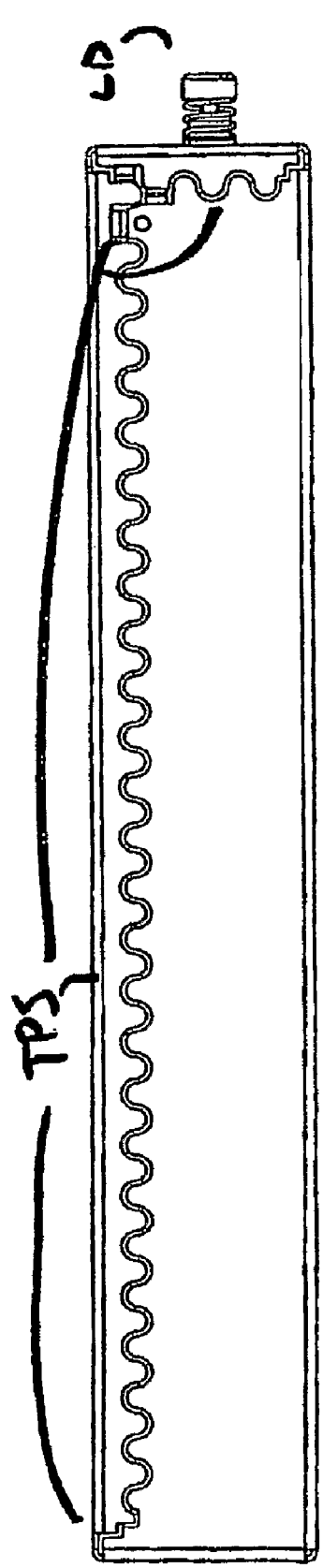
FIG. 4C is a side view of the two-dimensional EMI shielding enclosure.
Figure 4D:
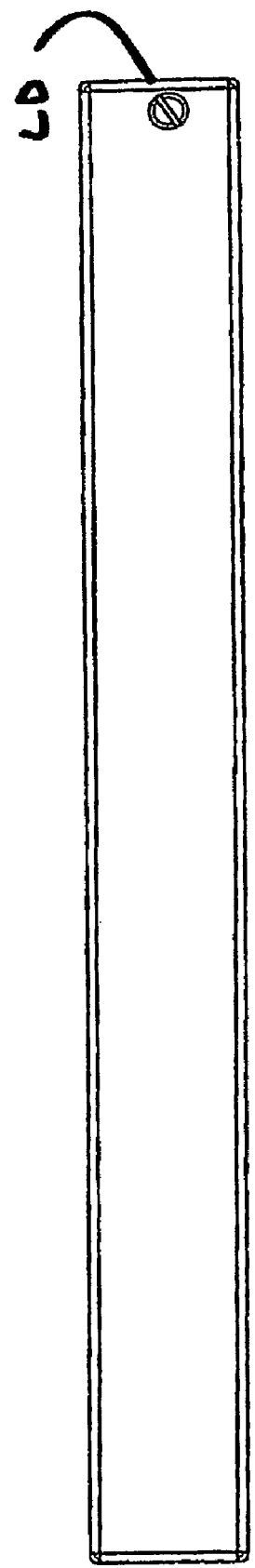
FIG. 4D is a front view of the two-dimensional EMI shielding enclosure.

FIG. 4C is a side view of the two-dimensional EMI shielding solution for computer enclosures. Again, from the top, there's just the one line across the top front that is shown which would be exactly the same on the bottom. There is one line on the sides and also at the front running up and down the 1-U dimension, both at the front and back and which is all that is seen from the side. Along the top edge of the side and on the back of the top edge, both seams are seen, near the corner on the back of both edges. Also shown in FIG. 4B is a view of the isometric of the rear back corner and The TORTURED PATH™ edges along the top and the side and down the back corner of the base of the chassis which are seen and then both edges of the lid come down into that corner.

If the corner is examined in detail. At the close-up of the front right corner, there are formed tabs that are bent down and go up one plane and around behind the other plane. In this case, there's one formed from the lid that goes behind the side wall. The side wall goes behind the front face and also the front face goes behind the lid, creating a "three-way convergence" or locking corner. These three pieces come together but they nest over and under each other so they're all interlocked without using any fasteners, which further reduces manufacturing cost. In each case, with the slot length around these tabs (or whether it goes around where the phalange which is for the mounting screw) the length is kept below the allowable length for a 2 GHz EMI shielding or whatever frequency is selected to control. A hole on the top right provides additional flexibility for this embodiment of the present invention and allows a rivet to be used to adjoin the lid to the base. In a configuration without a removable lid, a counter-sunk screw may be used. In this case, remove and take the lid off, take the face right off, take the lid off and there is access to the inside of the box. As illustrated by this principle, a particularly attractive feature of the present invention is that no matter what feature is surrounding The TORTURED PATH™ solution in this embodiment of the present invention, it is implemented in such a way that there is a minimal aperture length maintained and therefore controls the necessary EMI.

The illustrations respectively show the same front corner of the 17½ inch (in a preferred embodiment, but dimensions are dependent on end-use) 1-RU box and it shows how the tongue tabs UTBs and LTBs would over-lock and interlock with one and other and would make together to bring this whole assembly together, which sort of a tongue and groove type thing. An excellent assembly for minimizing fasteners would help to align the chassis and could bring some electrical contacts together, although it's not dependent on it for EMI. Also, here it uses captive fasteners, both in the screwed or retaining screw, and also there is a pem-nut PN, which is mounted to the back of the mounting phalange MP. This shows that once stamped and formed the features are very simple and provided at a very low cost. This is a highly effective manner for fabricating, assembling, and maintaining EMI which is a low cost, high performance and excellent solution.

FIGS. 4A-4D illustrate that the solution provided in the computer enclosure applications of present invention can be implemented with ease in all major manufacturing methods including: stamped, laser cut, cast, extruded, molded, etc. In each manufacturing method, almost all of the benefits of each (detailed above) will apply. Further, because there is a "gap" between mating components, the tolerances in the fabrication process are as "liberal" as possible. The liberal tolerances further accentuate reliability and ensure the highest possible yield of parts off the manufacturing line, so that generally, there are no fit issues. Further, the "one-hit" two-dimensional solution can improve packaging flexibility and thermal performance as well. For example, the inventive solution may be used not only for chassis fabrication, but also for modules, FRUs, connectors and other I/O components that require EMC protection/shielding. The inventive solution to cut shapes to provide great open areas for airflow, does not adversely impact the EMI performance and leads to the conclusion that manufacturing cost remains low, while thermal performance remains high.

From an improved EMI-shielding (leaking and protection) perspective, if the apertures are cut with maximum efficiency, the EMI without an antennae that it needs to radiate, the thermals open up (hopefully not at the cost of EMI performance.) One can extend this concept into industrial design and then start to take these cuts and make them part of the industrial design. Similar to enhancing thermals, lowering costs relative to gaskets, screws, welds, etc. is one hundred percent reliable. There's absolutely no reliability degradation over time. When these two things are brought together, there's an air gap. There are no compression setting gaskets. There is no deforming or bending of beryllium copper. There is no separating of foam over fabric gaskets, which separate. They are sheared, they separate, and they're bonded with adhesive or something similar. When they are sheared, they may fail. The compression is set over time and they lose performance over time. The beryllium copper is outlawed in Europe. It bends and spoons bend, and they depend on physical contact. This, however, doesn't depend on physical contact. It's 100 percent reliable over the life of the product. Additionally, with the gap size set right, where the gap size is twice the total summation of the geometric tolerances, it will fit together in sequence, providing a "never-fail" assembly with virtually no assembly defects. This is designed to have zero assembly defects. It will always assemble and it will be 100 percent reliable.

Twice the geometric is the normal summation of geometric tolerances. If there is a gap which is double, there will be 100 percent margin of safety against any assembly error, any assembly defect. In this embodiment, there is an infinite safety and an infinite reliability in assembly. There will be no assembly errors. The two-dimensional embodiment of the invention provides a solution with no waste or failures in assembly. A face plate will not bind or crash in front of a customer. Inspection can be eliminated and result in lowering costs. It is environmentally friendly with zero impact to the environment. All pre-plate material can be used which is very important. Pure pre-plate may be used with no concern about post-plating anymore. All the entrapment issues and the environmental issues associated with the cost are eliminated. With post-plates, one must take all the sheet metal. It is necessary to ship some of it to somebody that plates it, to get it all plated and packaged up properly so it doesn't get all scratched. However, in this case, this can all be done with pre-plate material, 100 percent. The only process is to ship it and do the assembly.

The two-dimensional embodiment of the invention provides ease of manufacture and cost reduction in the assembly process, because there are no welds necessary or any post-operations. When welding is part of the process, there must also be post-plating because it is not possible to weld pre-plate. It would ruin the plating. Otherwise, if there is a weld and then the post-plate, the whole thing must be mapped. The problem is, if there is a map with a post-plate, if there are any hems, the result is entrapment; with entrapment, there exists a source for oxidation. So if the plating material is entrapped, it just sits there in the gap, or it doesn't get in at all. It either gets entrapped or it doesn't penetrate and if there is enough safe oxidation, there is corrosion. In this embodiment, that's all eliminated.

Referring again now to FIGS. 5A-13, a "3-D Box" or three-dimensional EMI shielding solution implementation is shown. A preferred embodiment of the three-dimensional implementation of the invention is discussed above.

Figure 6:
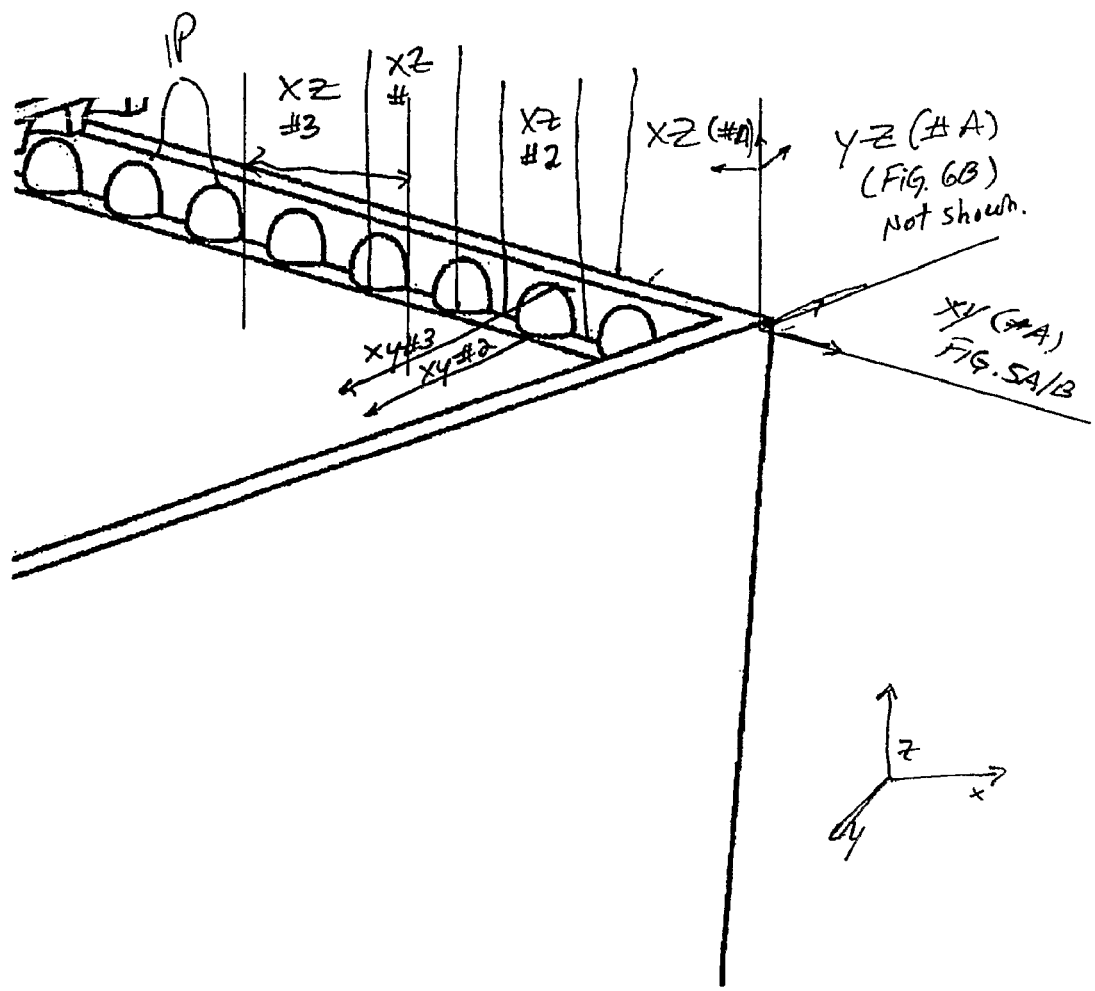
FIG. 6 illustrates the planes of the shapes in the five-sided box in a first embodiment of the invention from a frontal view.
Figure 7:
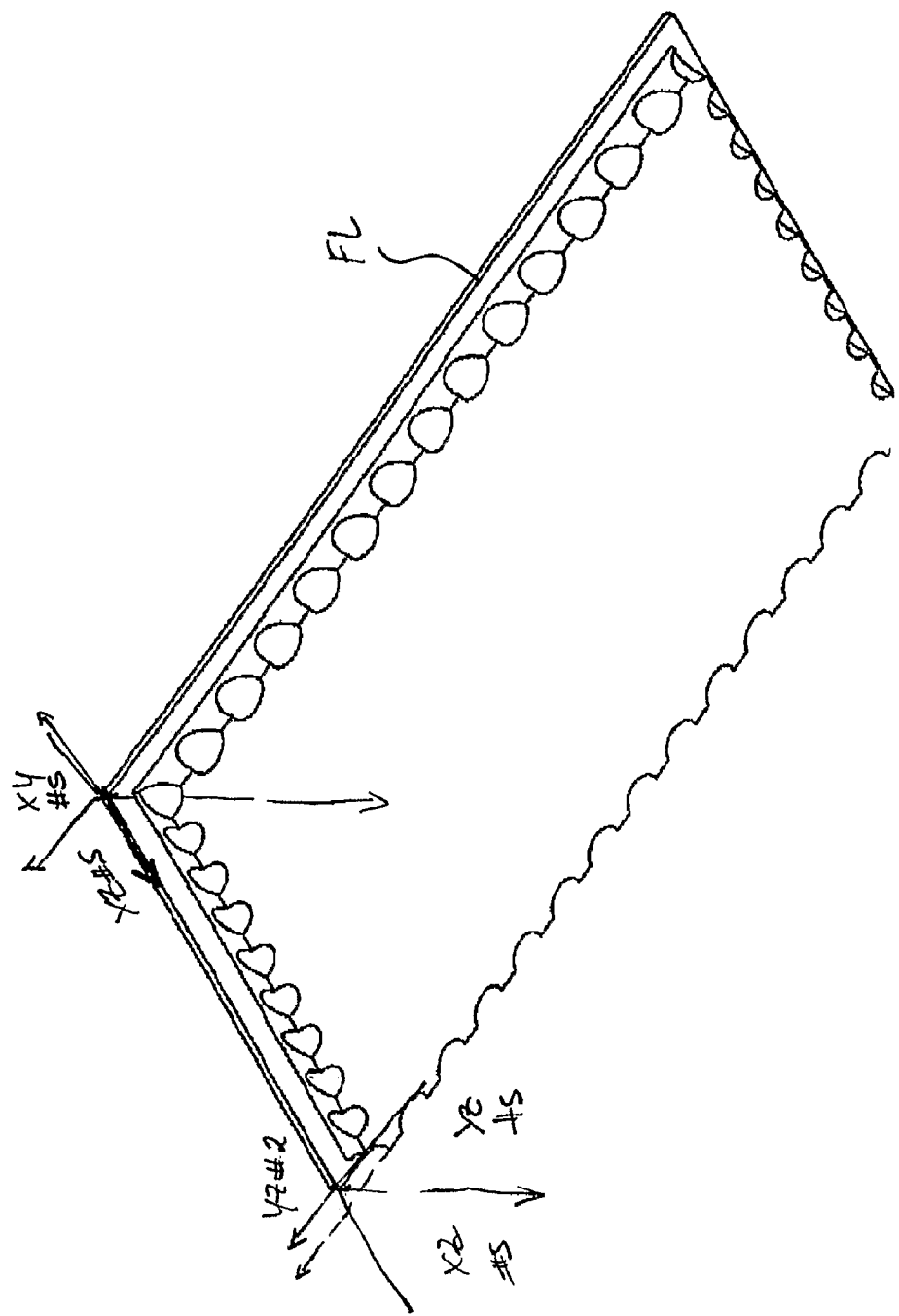
FIG. 7 illustrates the planes of the shapes stamped into the flange of the first embodiment of the invention.

FIGS. 6 and 7 show different views of the five-sided box and lid, respectively of the inventive enclosure in the preferred embodiment. Now referring to FIG. 6, it is helpful to think of the some other planes formed by the three-dimensional shapes in both the lid and the box. For example, there are other "XY" planes that are formed by bottom of the "male" partial spheres in the box FSE, labeled as "plane XY(#2)", the top of the male partial spheres as "plane XY(#3)". For purposes of considering EMI shielding requirements for the electronic enclosure, other planes may be considered in view of each seam, such as the YZ and XZ planes formed at the intersection of the box FSE and the flange/lid FL. The YZ Planes formed from the seam at the respective junction of the box FSE and the lid FL include Planes YZ(#A) and YZ(#A)', respectively. There are also the planes formed from the inside (closest to the middle of the enclosure) part of the three-dimensional shape IP, which may be the interior plane of the male shapes XZ#3 and the part closest to the interior wall, as XZ#2. The XZ and YZ planes will be similar in structure and function because they are formed by the width and length of the enclosure. The planes are described for illustration purposes and should not be seen as limited the scope of the invention or the possible application of various embodiments.

TABLE 6

Planes formed by three-dimensional shapes in the five-sided enclosure.

| Plane | Description |
| --- | --- |
| XY#A | Plane formed by seam of the juncture of the lid and the five-sided enclosure, parallel to the top of the phalange. |
| XY#2 | Plane formed by the "bottom" of the male scallop and parallel to XY#A. |
| XY#3 | Plane formed by the "top" of the male scallop and parallel to XY#A |
| XZ#A | Plane formed by the width of the five-sided enclosure perpendicular to the lid surface. |
| XZ#2 | Plane formed by the innermost point of the male scallop and parallel to the XZ#A plane. (Generally the interior wall of the five-sided enclosure). |
| XY#3 | Plane formed by the outermost point of the male scallop and parallel to the XZ#A plane. |
| YZ#A | Plane formed by the length of the five-sided enclosure perpendicular to the lid surface. |
| YZ#2 | Plane formed by the innermost point of the male scallop and parallel to the YZ#A plane. (Generally the interior wall of the five-sided enclosure). |
| YZ#3 | Plane formed by the outermost point of the male scallop and parallel to the YZ#A plane. |

Referring to FIG. 7, the planes formed by the "female" scallop or partial spheres is shown. FIG. 7 shows a front view of the lid and the three relevant planes and the "subplanes"

formed by the female scallop or quarter-spheres for purposes of provided electromagnetic interference shielding. In general, these planes will be a small gap from their counter-parts with the male three-dimensional shapes in the five-sided enclosure. However, the XY#A plane should correspond very closely to the XY#S plane in particular embodiments. In alternate embodiments (discussed below in FIG. 10), the gaps can be adjusted to provide thermal or manufacturing advantages, but may compromise some of the EMI shielding. The end-user of the alternate embodiments may have specific tradeoffs in terms of "gaps" for different electronic enclosures.

TABLE 7

Planes formed by three-dimensional shapes in the lid.

| Plane | Description |
| --- | --- |
| XY#S | Plane formed by seam of the juncture of the lid and the five-sided enclosure, parallel to the top of the phalange. |
| XY#4 | Plane formed by the "bottom" of the female scallop and parallel to XY#S. |
| XY#5 | Plane formed by the "top" of the female scallop and parallel to XY#S. |
| XZ#S | Plane formed by the width of the phalange and perpendicular to the lid surface. |
| XZ#4 | Plane formed by the innermost point of the female scallop and parallel to the XZ#S plane. |
| XY#5 | Plane formed by the outermost point of the female scallop and parallel to the XZ#S plane. |
| YZ#S | Plane formed by the length of the phalange perpendicular to the lid surface. |
| YZ#4 | Plane formed by the innermost point of the female scallop and parallel to the YZ#S plane. |
| YZ#5 | Plane formed by the outermost point of the female scallop and parallel to the YZ#S plane. |

Referring to FIG. 8A, detail of the "female" three-dimensional structures in the flange is shown. FIG. 8B illustrates the detail of the "male" three-dimensional structures in the five-sided box. As stated above the "gap" or "fit" between the male and female dimensional shapes may vary between particular embodiments of the invention, depending on the needs of the end users.

Figure 9A:
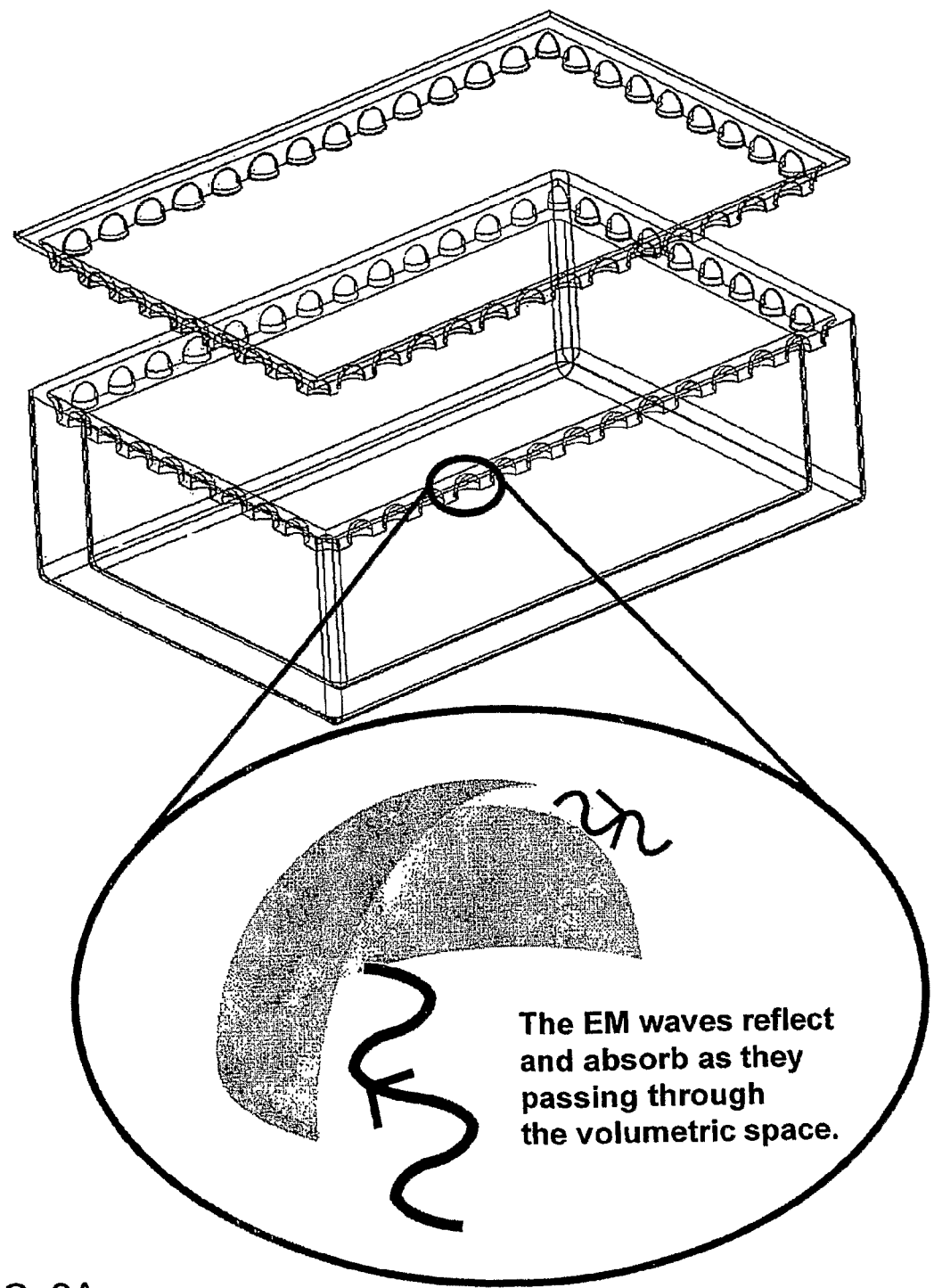
FIG. 9A illustrates the principle of the EMI shielding in a sample three-dimensional shape of the inventive enclosure.

Referring now to FIGS. 9A and 9B, the "torture chambers" are shown in operation as they serve to provide electromagnetic interference shielding in and out of the enclosure. These interesting molded or cast shapes that generally do not allow the wave to propagate and it will be reflected continually and eventually absorbed as it tries to make it through the interface or plane of the seam (see Plane #A, above). Because the gaps between each of these are not sufficient to form antennae on the outside of the box or through the gap, then the electromagnetic interference is basically fully absorbed. In this particular illustration, as shown in FIG. 9B, the lid will have a phalange, so there will also be a wave guide effect from the phalange. In general, there will be a very short aperture which will provide wave guide effects with the "torture chambers" apertures themselves. With the shortening the aperture size and creating a tortured chamber, a wave guide and then a wave guide phalange working in concert. As illustrated, there is virtually no possibility of the EMI escaping in the chassis with no gaskets, no fasteners intermittently around the lid. The lid is just tacked down (or other fastening means) in a couple of places, whatever is required or, alternately, a latch in one other place. The preferred embodiment is very straightforward with virtually no fasteners and an excellent EMI protective container.

Figure 10:
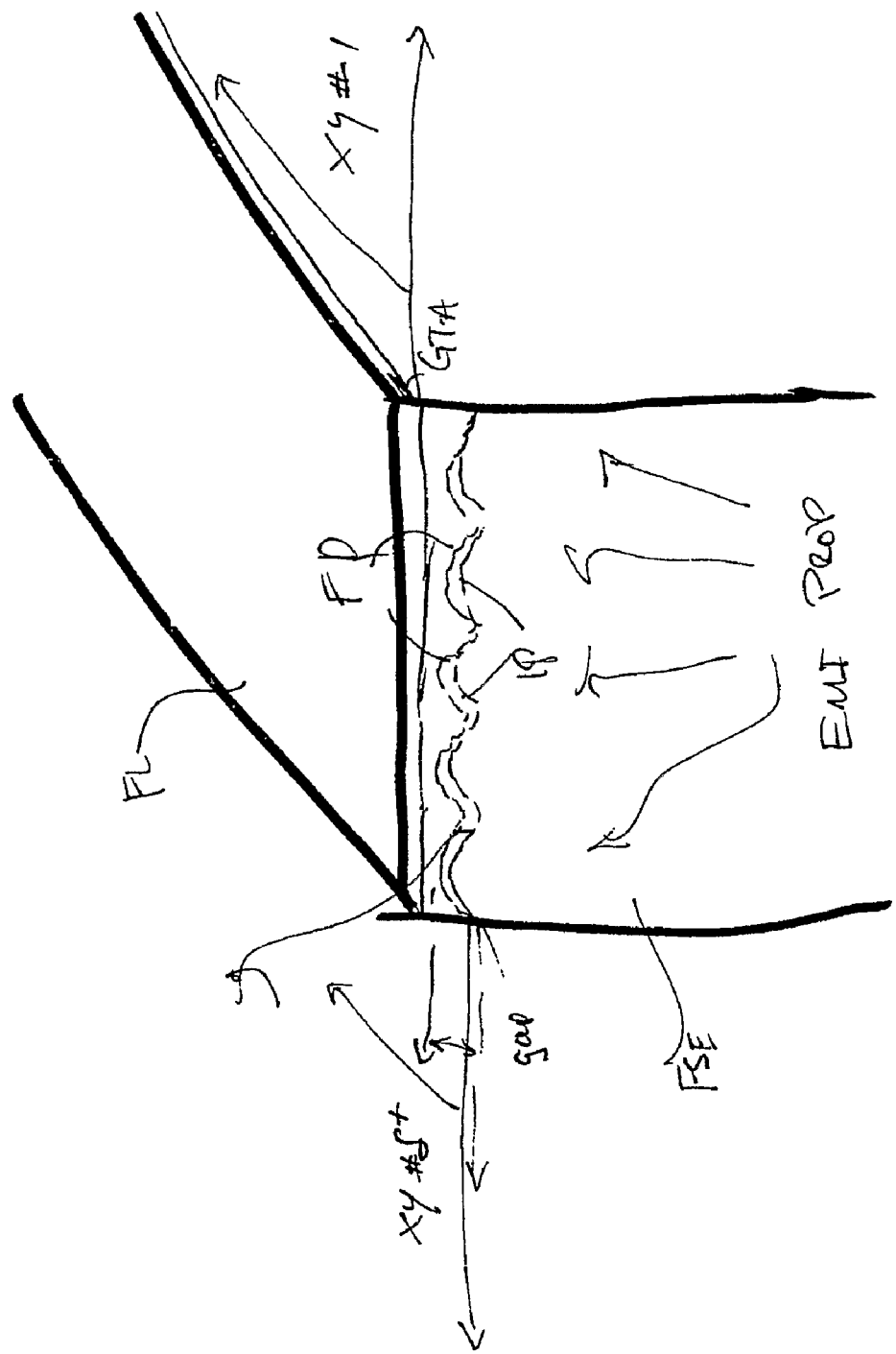
FIG. 10 illustrates further operations of the invention in providing EMI shielding.

FIG. 10 also shows a functional diagram of the EMI protection provided by the particular embodiments of the invention. The electromagnetic interference EMI PROP is propagated in all directions from the electronic device (not shown). The gap between the box and the lid GAP is of width g, and can vary from embodiment to embodiment. Optionally, a gap adjustment structure GTA may be used to improve ventilation by increasing the gap g. Thus, a particular embodiment may be versatile enough for different end uses. As can be seen, the plane formed by the actual seam XY#1 is "above" the plane where the formation of the structures at the female/male interface is located XY#S+ (which undulates between the XY#2(4) and XY#3(5)). In other embodiments (not shown), the plane formed by the seam can be across the plane formed by the female/male interface, depending on the complexity and needs of the end user.

Figure 11A:
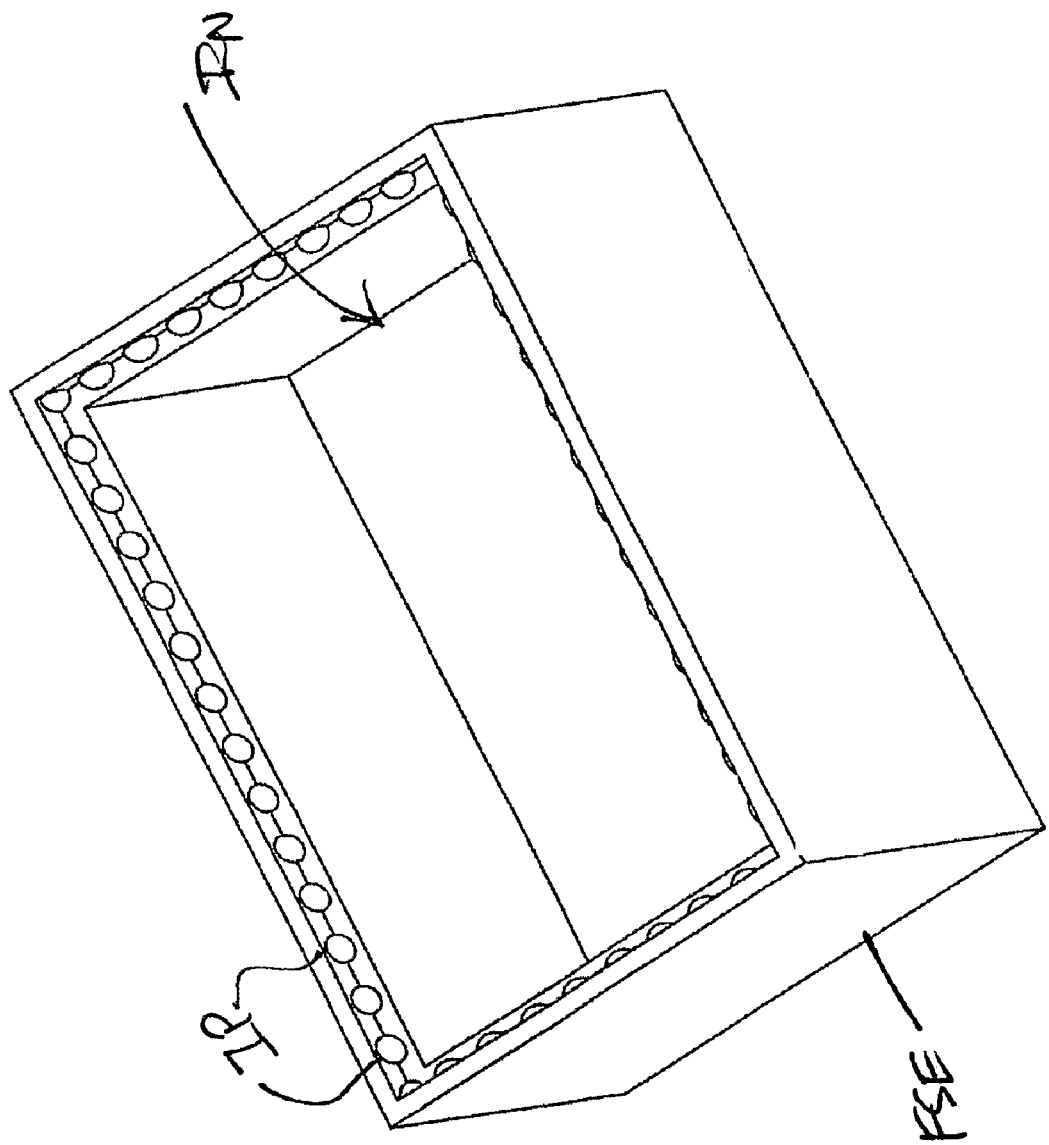
FIG. 11A illustrates the interior of the three-dimensional embodiment of the invention in the box component.
Figure 11B:
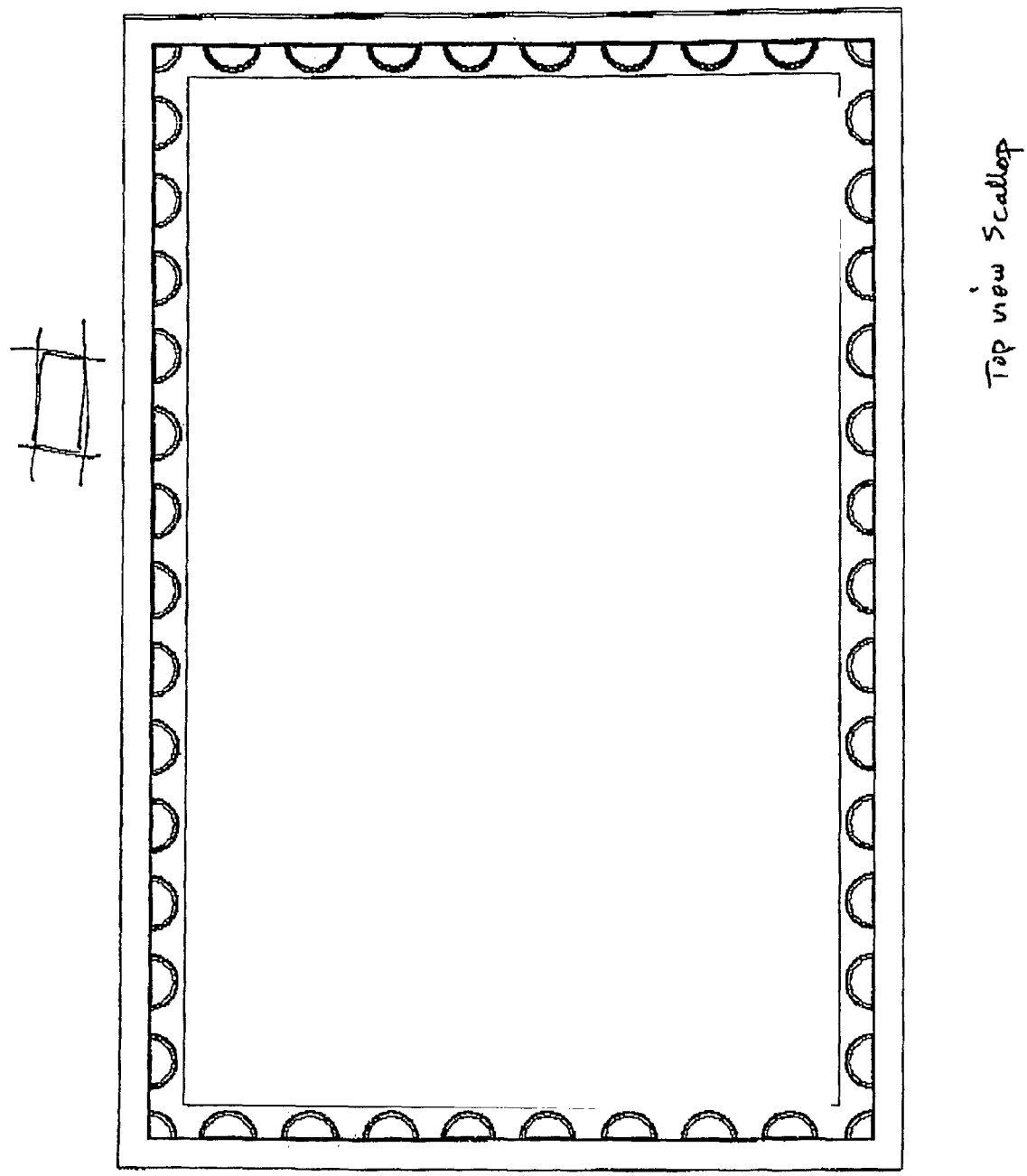
FIG. 11B illustrates a top-down view of the invention in the did component.
Figure 11C:
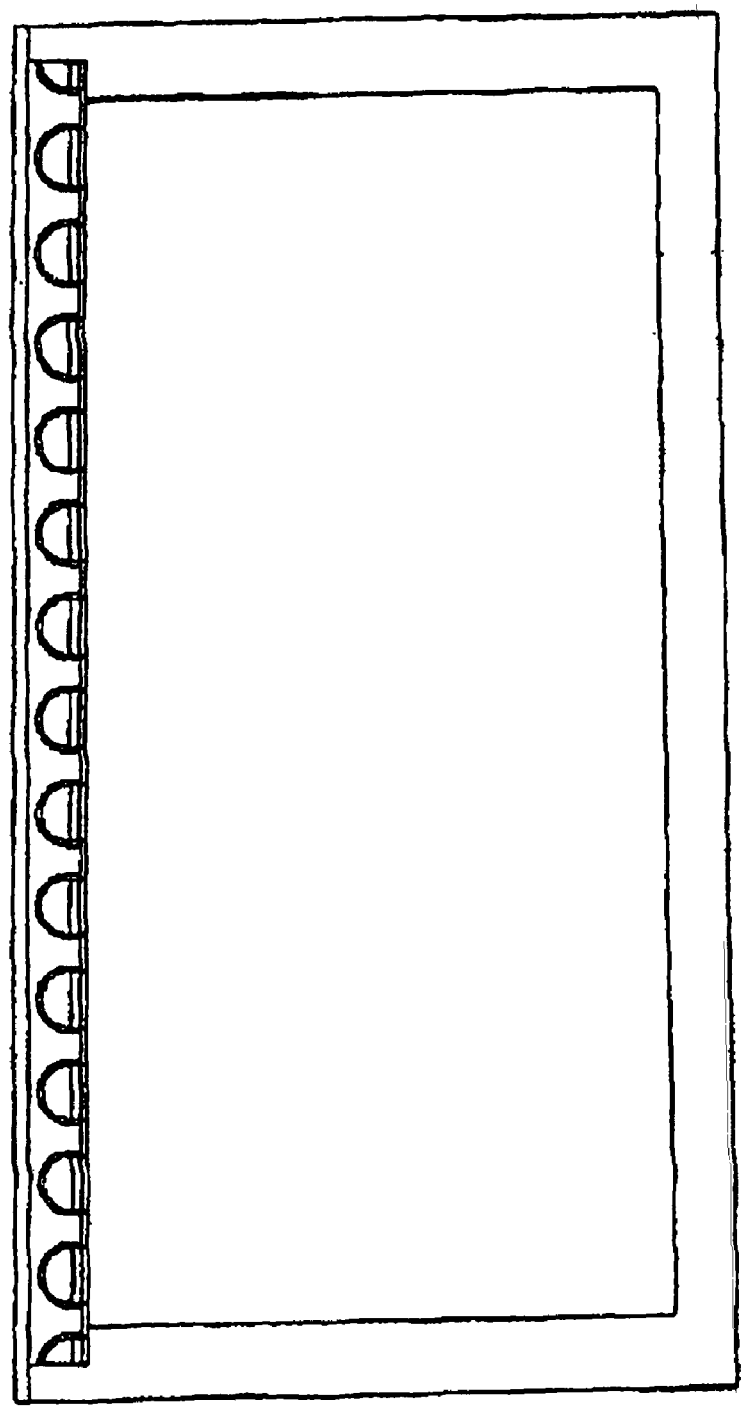
FIG. 11C shows a side view of the box component in a first embodiment.

FIGS. 11A-11C are detailed views of the five-sided enclosure FSE in a primary embodiment and the interior pattern IP from angled, top, and side views respectively.

Figure 12:
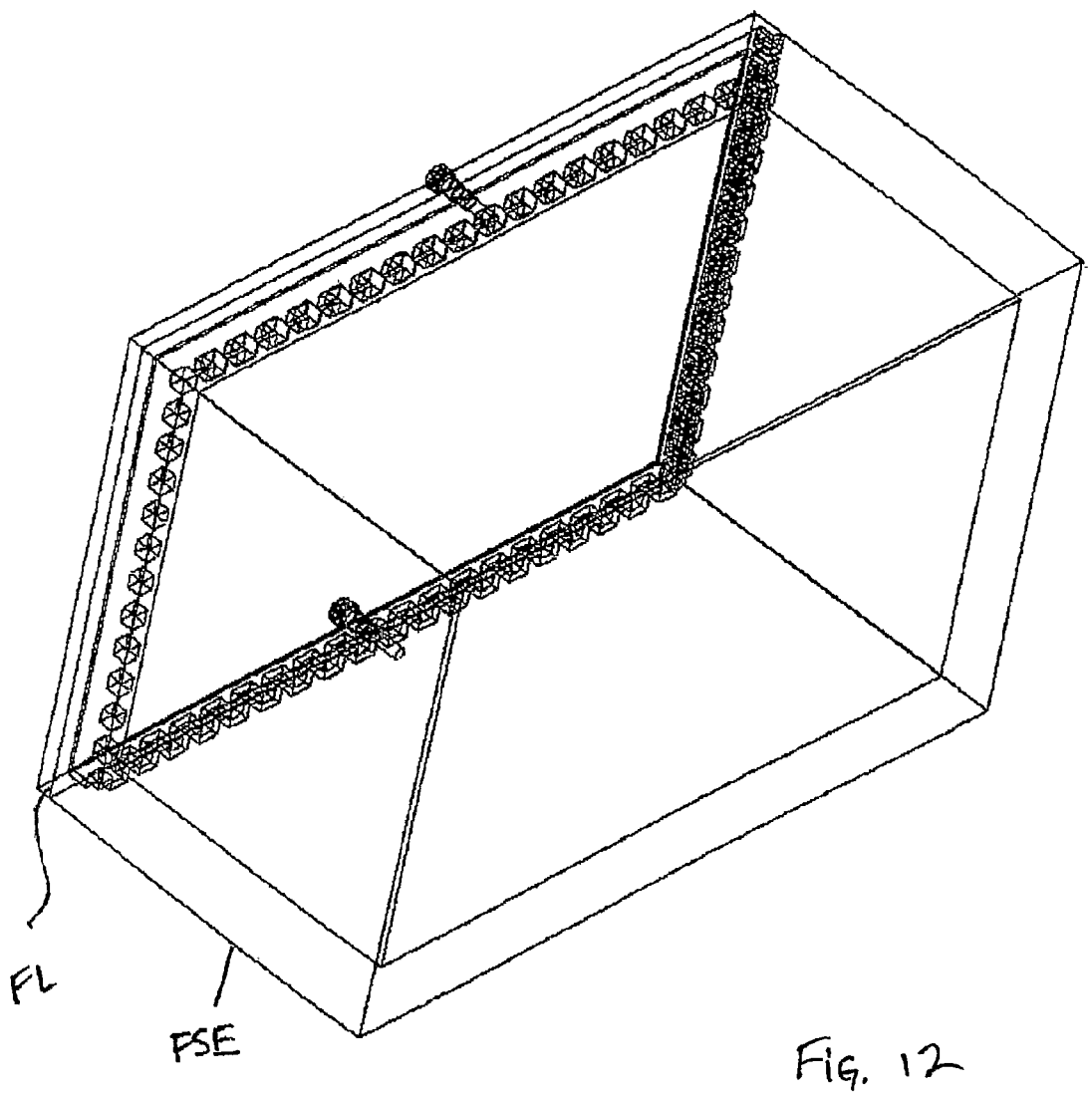
FIG. 12 illustrates an alternate embodiment of the invention using a single row of cubic shapes.
Figure 13:
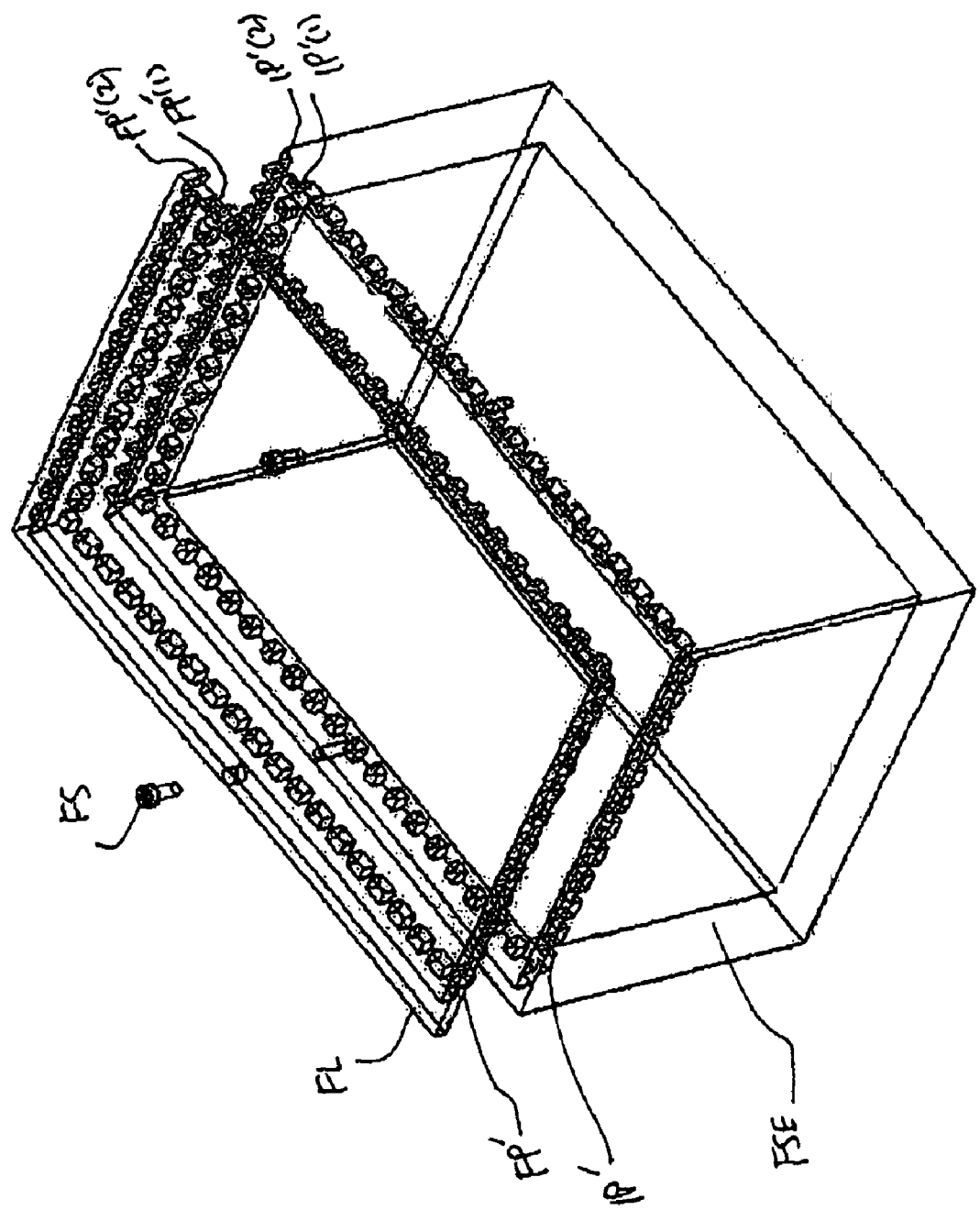
FIG. 13 shows a double row of cubic shapes in another alternate embodiment.

As can be appreciated by those skilled in the art, other three-dimensional shapes may also be used, such as the single row of cubic structures shown in FIG. 12, or the double row of cubic structures shown in FIG. 13, without limiting the scope of the invention or the possible embodiments. Certain three-dimensional shapes provide EMI shielding advantages, which must be weighed against the manufacturing advantages provided by other types of shapes. Thus, while a ¼-sphere, as shown in FIGS. 5-7, will provide one type of advantage, while a three-dimensional shape such as the cubic shape shown in FIGS. 12 and 13, will provide the advantage of manufacturing simplicity.

Figure 14:
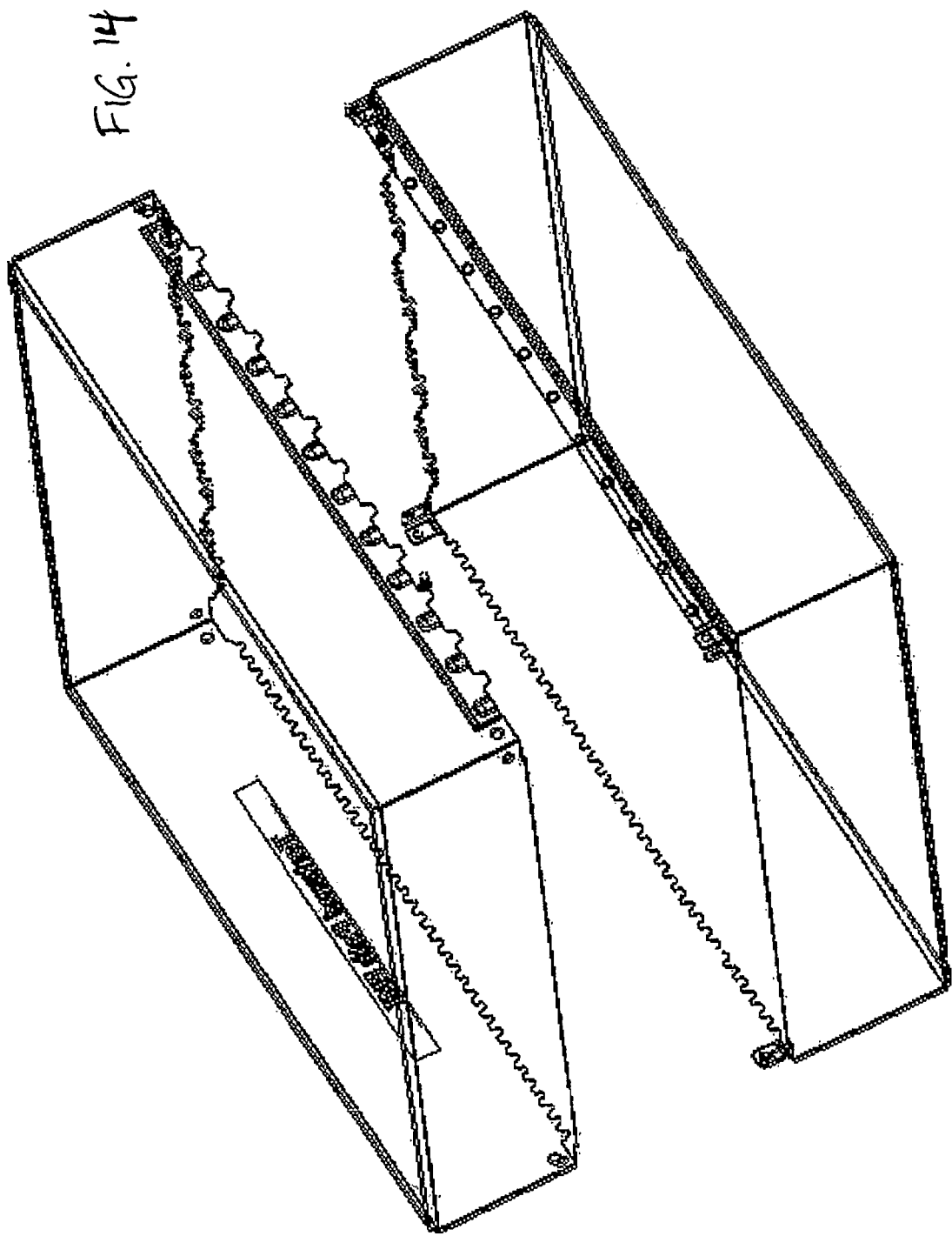
FIG. 14 shows a hybrid configuration using both two-dimensional and three-dimensional shielding structures.

FIG. 14 illustrates a "hybrid" embodiment of the invention incorporating both two and three dimensional features in combination or separately to provide electromagnetic interference shielding for an electronics enclosure.

What is claimed is:

1. An enclosure for a computer or other electronic device comprising:
   electromagnetic interference shielding (EMI) made of an electrically conducting material,
   wherein said enclosure has six sides of electrically conducting material,
   wherein at least two of said sides are formed or cut such that they have a sweeping three-dimensional multi-planar wave attenuation portion covering at least a portion the width of the side such that said sweeping three-dimensional multi-planar wave attenuation portion interferes with EMI wave propagation, such that sufficient shielding is provided by said wave attenuation portions.

2. The enclosure as recited in claim 1, wherein said sweeping three-dimensional multi-planar wave attenuation portion is raised away from the interior volume of said enclosure.

3. The enclosure as recited in claim 1, wherein said sweeping three-dimensional multi-planar wave attenuation portion is lowered towards the interior volume of said enclosure.

4. The enclosure as recited in claim 1, wherein said sweeping three-dimensional multi-planar wave attenuation portion is stamped, molded, formed, extruded, or casts.

5. The enclosure as recited in claim 1, wherein said sweeping three-dimensional multi-planar wave attenuation portion runs along the edge of the top surface of said enclosure.

6. The enclosure as recited in claim 1, wherein said sweeping three-dimensional multi-planar wave attenuation portion includes a number of raised features appropriately spaced to attenuate the range of frequencies that require shield.

7. The enclosure as recited in claim 6, wherein said features include a partial sphere.

8. The enclosure as recited in claim 6, wherein said features include a partial cylinder.

9. A method for providing improved electromagnetic interference (EMI) shielding for an electronic device, comprising:
a multiple piece enclosure made of electrically conductive material, and with at least one seam, including the acts of:
creating sweeping three-dimensional multi-planar EMI shielding shapes running along at the perimeter of one of said pieces of said multiple piece enclosure; and
assembling said enclosure such that said series of three-dimensional EMI shielding shapes cross the plane formed by said at least one seam.

10. The method as recited in claim 9, wherein said sweeping three-dimensional multi-planar EMI shielding shapes are partially spherical.

11. A multiple-piece enclosure for an electronic device comprising:
a five-sided enclosure with an interior space, said enclosure including an open side and a first electromagnetic interference (EMI) shielding pattern arranged along the top perimeter of said open side,
wherein said first EMI shielding pattern includes a series of sweeping three-dimensional multi-planar shapes continuous along said perimeter; and a flange shaped to fit onto said enclosure, creating a six-sided enclosure, said flange including a second electromagnetic interference (EMI) shielding pattern that includes a series of three-dimensional multi-planar shapes around the perimeter of the bottom side of said flange.

12. The enclosure as recited in claim 11, further including connecting pieces that fit through the top of said flange into said perimeter of said five-sided enclosure.

13. The enclosure as recited in claim 11, wherein said first and second three-dimensional EMI shielding patterns are shaped to be complementary such that they fit together when said flange is placed on said five-side enclosure.

14. The enclosure as recited in claim 11, wherein said first pattern includes two rows of said sweeping three-dimensional multi-planar shapes around the perimeter of said five-sided enclosure.

15. The enclosure as recited in claim 11, wherein said first and second three-dimensional patterns are spherical.

16. The enclosure as recited in claim 15, wherein said first pattern includes three-dimensional spherical shapes around the sided enclosure.

17. The enclosure as recited in claim 11, wherein said first and second three-dimensional patterns are partially cylindrical.

18. A computer enclosure providing sufficient EMI/EMC shielding comprising;
at least multiple sides are constructed such that sinusoidal multi-planar three-dimensional shapes are shaped in two-dimensions and then shaped again into the orthogonal planes, such that orthogonal planes have sweeping shapes that force the EMI to traverse through narrowed apertures for the use of shaping, wherein said material around a chassis is made of electromagnetic conductive material.

* * * * *